(12) United States Patent
Chung et al.

(10) Patent No.: US 7,336,031 B2
(45) Date of Patent: Feb. 26, 2008

(54) ORGANIC LIGHT EMITTING DISPLAY HAVING AUXILIARY COMMON ELECTRODE

(75) Inventors: Jin-Koo Chung, Suwon-si (KR); Joon-Hoo Choi, Seoul (KR); Beom-Rak Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 88 days.

(21) Appl. No.: 10/997,996

(22) Filed: Nov. 29, 2004

(65) Prior Publication Data

US 2005/0127828 A1 Jun. 16, 2005

(30) Foreign Application Priority Data

Nov. 28, 2003 (KR) ............ 10-2003-0085490

(51) Int. Cl.
*H01J 1/62* (2006.01)
(52) U.S. Cl. ..................... 313/506; 313/504
(58) Field of Classification Search ......... 313/498–509
See application file for complete search history.

(56) References Cited

U.S. PATENT DOCUMENTS

| 6,946,791 | B2 * | 9/2005 | Choi et al. ............ 313/506 |
| 2004/0027058 | A1 * | 2/2004 | Park .................... 313/504 |
| 2005/0001963 | A1 * | 1/2005 | Yokoyama ............. 349/122 |
| 2005/0057151 | A1 * | 3/2005 | Kuwabara ............. 313/506 |

* cited by examiner

*Primary Examiner*—Joseph Williams
*Assistant Examiner*—Bumsuk Won
(74) *Attorney, Agent, or Firm*—Cantor Colburn LLP

(57) ABSTRACT

An organic light emitting display is provided, which includes: a first electrode formed on a substrate; a partition having an opening exposing the first electrode at least in part; an auxiliary electrode formed on the partition and having substantially the same planar shape as the partition; an organic light emitting member formed on the first electrode and disposed substantially in the opening; and a second electrode formed on the light emitting member and the auxiliary electrode.

12 Claims, 54 Drawing Sheets

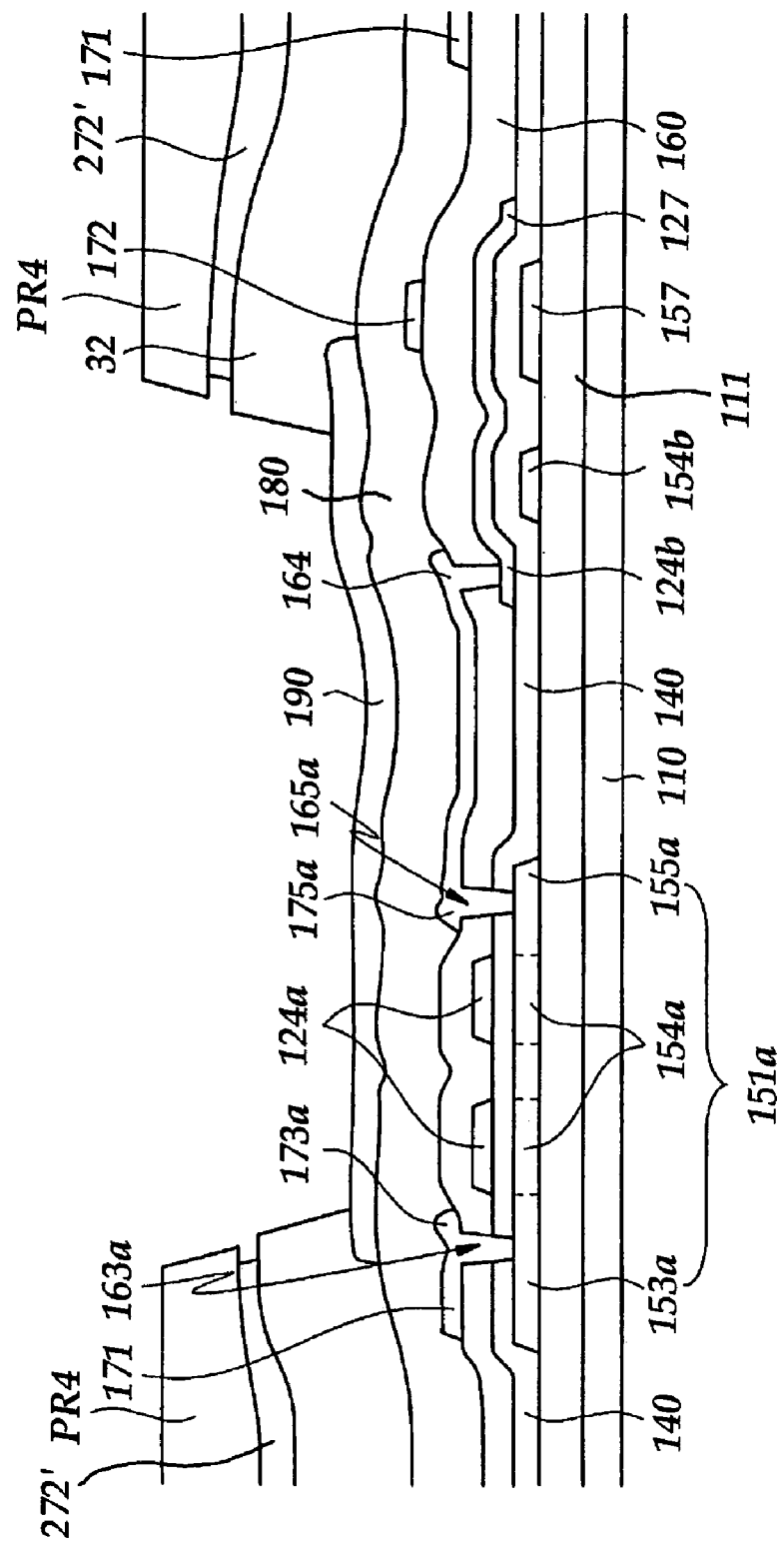

ORGANIC LIGHT EMITTING DISPLAY HAVING AUXILIARY COMMON ELECTRODE

BACKGROUND OF THE INVENTION (a) Field of the Invention

The present invention relates to an organic light emitting display and a manufacturing method thereof.

(b) Description of Related Art

An organic light emitting display (OLED) is a self emissive display device, which displays images by exciting an emissive organic material to emit light. The OLED includes an anode (hole injection electrode), a cathode (electron injection electrode), and an organic light emission layer interposed therebetween. When the holes and the electrons are injected into the light emission layer, they are recombined and pair annihilated with emitting light. The light emission layer further includes an electron transport layer (ETL) and a hole transport layer (HTL) as well as an electron injecting layer (EIL) and a hole injecting layer (HIL) for enhancing the light emission. Each pixel of the OLED includes two TFTs, i.e., a switching TFT and a driving TFT. The current for light emission is driven by the driving TFT and the mount of the current driven the driving TFT is controlled by the data signals from the switching TFT.

A plurality of pixels of the OLED, each including an anode, a cathode, and a light emission layer, are arranged in a matrix and driven in passive matrix (or simple matrix) addressing or active matrix addressing.

The passive matrix type OLED includes a plurality of anode lines, a plurality of cathode lines intersecting the anode lines, and a plurality of pixels, each including a light emission layer. The selection of one of the anode lines and one of the cathode lines cause light emission of a pixel located at the intersection of the selected signal lines.

The active matrix type OLED includes a plurality of pixels, each including a switching transistor, a driving transistor, and a storage capacitor as well as an anode, a cathode, and a light emission layer. The OLED further includes a plurality of gate lines transmitting gate signals and a plurality of data lines transmitting data voltages. The switching transistor is connected to one of the gate lines and one of the data lines and transmits the data voltage from the data line in response to the gate signal. The driving transistor receives the data voltage from the switching transistor and drives a current having a magnitude determined depending on the difference between the data voltage and a predetermined voltage such as a supply voltage. The current from the driving transistor enters the light emission layer to cause light emission having an intensity depending on the current. The storage capacitor is connected between the data voltage and the supply voltage to maintain their voltage difference. The gray scaling of the active matrix type OLED is accomplished by controlling the data voltages to adjust the current driven by the driving transistor. The color representation of the OLED is obtained by providing red, green and blue light emission layers.

In the meantime, the OLED is classified into top emission type and bottom emission type depending on the light emitting direction. The top emission type OLED includes a transparent cathode usually made of indium tin oxide (ITO) or indium zinc oxide (IZO) and an opaque anode, while the bottom emission type OLED includes an opaque cathode and a transparent anode. The relative positions of the anode and the cathode can be altered if required.

Since ITO and IZO have high resistivity, the top emission type OLED may add an auxiliary electrode having low resistivity to the cathode. However, the addition of the auxiliary electrode requires an additional lithography step that may complicate the manufacturing process and increase the manufacturing cost.

SUMMARY OF THE INVENTION

A motivation of the present invention is to solve the problems of conventional techniques.

An organic light emitting display is provided, which includes: a first electrode formed on a substrate; a partition having an opening exposing the first electrode at least in part; an auxiliary electrode formed on the partition and having substantially the same planar shape as the partition; an organic light emitting member formed on the first electrode and disposed substantially in the opening; and a second electrode formed on the light emitting member and the auxiliary electrode.

The organic light emitting display may further include: a gate line transmitting gate signals; a data line transmitting data signals; a switching transistor connected to the gate line and the data line; a signal transmission line transmitting driving signals; and a driving transistor connected to the signal transmission line and the first electrode and controlled by the data signals;

The switching transistor and the driving transistor may be connected to each other and the organic light emitting display further comprising a storage capacitor connected between the switching transistor and the signal transmission line.

The first electrode may include reflective material, and the second electrode may include transparent material.

The auxiliary electrode preferably has a resistivity lower than the second electrode.

An organic light emitting display is provided, which includes: first and second semiconductor members including first and second intrinsic portions, respectively, and including amorphous silicon or polysilicon; a plurality of gate conductors that include a gate line including a first gate electrode overlapping the first intrinsic portion and a second gate electrode overlapping the second intrinsic portion; a gate insulating layer disposed between the first and the second semiconductor members and the gate conductors; a plurality of data conductors that includes a data line including a first source electrode connected to the first semiconductor member, a first drain electrode opposing the first source electrode with respect to the first intrinsic portion and connected to the first semiconductor member, a voltage transmission line including a second source electrode connected to the second semiconductor member, and a second drain electrode opposing the second source electrode with respect to the second intrinsic portion and connected to the second semiconductor member; a pixel electrode connected to the second drain electrode; a partition having an opening exposing the pixel electrode at least in part; an auxiliary electrode formed on the partition and having substantially the same planar shape as the partition; an organic light emitting member formed on the pixel electrode and disposed substantially in the opening; and a common electrode formed on the light emitting member and the auxiliary electrode.

The pixel electrode may include reflective material and the common electrode may include transparent material.

The auxiliary electrode preferably has a resistivity lower than the common electrode.

The organic light emitting display may further include a connecting member connecting the first drain electrode and the second gate electrode.

A method of manufacturing an organic light emitting display is provided, which includes: forming a plurality of first display electrodes; forming a partition having a plurality of openings exposing the first display electrodes at least in part; forming an auxiliary electrode on the partition; forming a plurality of organic light emitting members in the openings; and forming a second display electrode on the light emitting member and the auxiliary electrode, wherein the formation of the partition and the formation of the auxiliary electrode are performed by using a single lithography.

The formation of the partition and the formation of the auxiliary electrode may include: sequentially depositing an insulating layer and a conductively layer; forming a first photoresist on the conductive layer; sequentially etching the conductive layer and the insulating layer using the first photoresist as an etch mask to form a conductor and the partition; ashing the first photoresist to form a second photoresist; and etching the conductor to form the auxiliary electrode using the second photoresist as an etch mask.

The first display electrodes may include reflective material and the second display electrode may include transparent material.

A method of manufacturing an organic light emitting display is provided, which includes: forming first and second semiconductor members including amorphous silicon or polysilicon; forming a gate line including a first gate electrode and a second gate electrode; forming a gate insulating layer between the first and the second semiconductor members and the gate line and the second gate electrode; forming a data line including a first source electrode, a voltage transmission line, and first and second drain electrodes; forming a passivation layer on the data line, the voltage transmission line, and the first and the second drain electrodes; forming a pixel electrode on the passivation layer, the pixel electrode connected to the second drain electrode; forming a partition having an opening exposing the pixel electrode at least in part; forming an auxiliary electrode on the partition; forming an organic light emitting member in the opening; and forming a common electrode on the light emitting member and the auxiliary electrode.

The formation of the partition and the formation of the auxiliary electrode may include: sequentially depositing an insulating layer and a conductively layer; forming a first photoresist on the conductive layer; sequentially etching the conductive layer and the insulating layer using the first photoresist as an etch mask to form a conductor and the partition; ashing the first photoresist to form a second photoresist; and etching the conductor to form the auxiliary electrode using the second photoresist as an etch mask.

The pixel electrode may include reflective material and the common electrode may include transparent material.

The auxiliary electrode may have a resistivity lower than the common electrode.

BRIEF DESCRIPTION OF THE DRAWINGS

The present invention will become more apparent by describing preferred embodiments thereof in detail with reference to the accompanying drawings in which:

FIGS. 11, 13, 15, 17, 19, 21 and 23 are layout views of the OLED shown in FIGS. 1-3 in intermediate steps of a manufacturing method thereof according to an embodiment of the present invention;

and FIGS. 22A and 22B are sectional views of the OLED shown in FIG. 18 taken along the lines XIXA-XIXA' and XIXB-XIXB', respectively, and illustrate the step following the step shown in FIGS. 21A and 21B;

FIG. 23 is a layout view of an OLED according to another embodiment of the present invention;

DETAILED DESCRIPTION OF EMBODIMENTS

Figure 1:
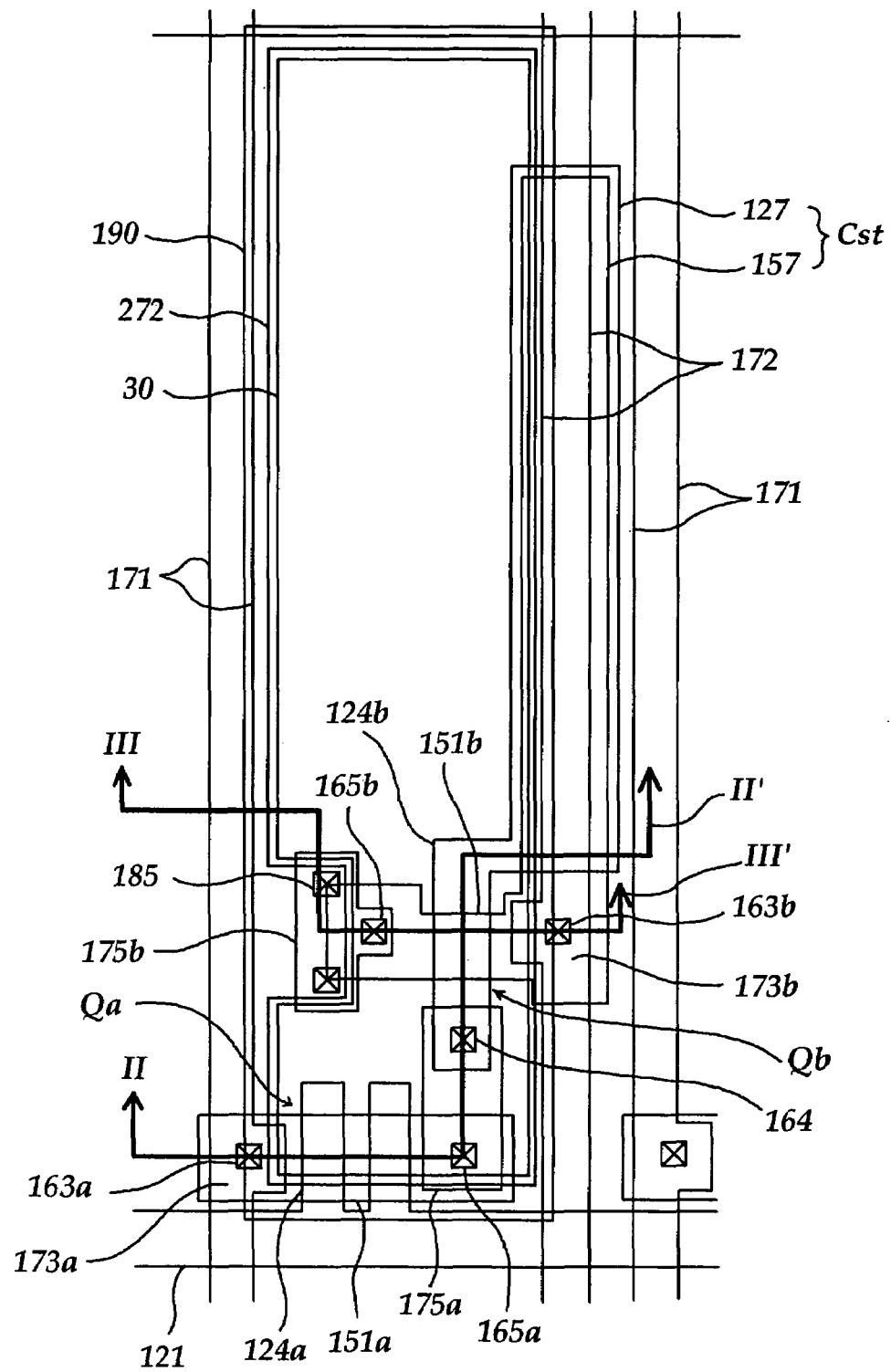
FIG. 1 is a layout view of an OLED according to an embodiment of the present invention.

The present invention now will be described more fully hereinafter with reference to the accompanying drawings, in which preferred embodiments of the invention are shown. The present invention may, however, be embodied in many different forms and should not be construed as limited to the embodiments set forth herein.

In the drawings, the thickness of layers, films, panels, regions, etc. are exaggerated for clarity. Like numerals refer to like elements throughout. It will be understood that when an element such as a layer, film, region or substrate is referred to as being "on" another element, it can be directly on the other element or intervening elements may also be present. In contrast, when an element is referred to as being "directly on" another element, there are no intervening elements present.

Now, OLEDs and manufacturing methods thereof according to embodiments of the present invention will be described with reference to accompanying drawings.

Now, an OLED according to an embodiment of the present invention is described in detail with reference to FIGS. 1-3.

Figure 2:
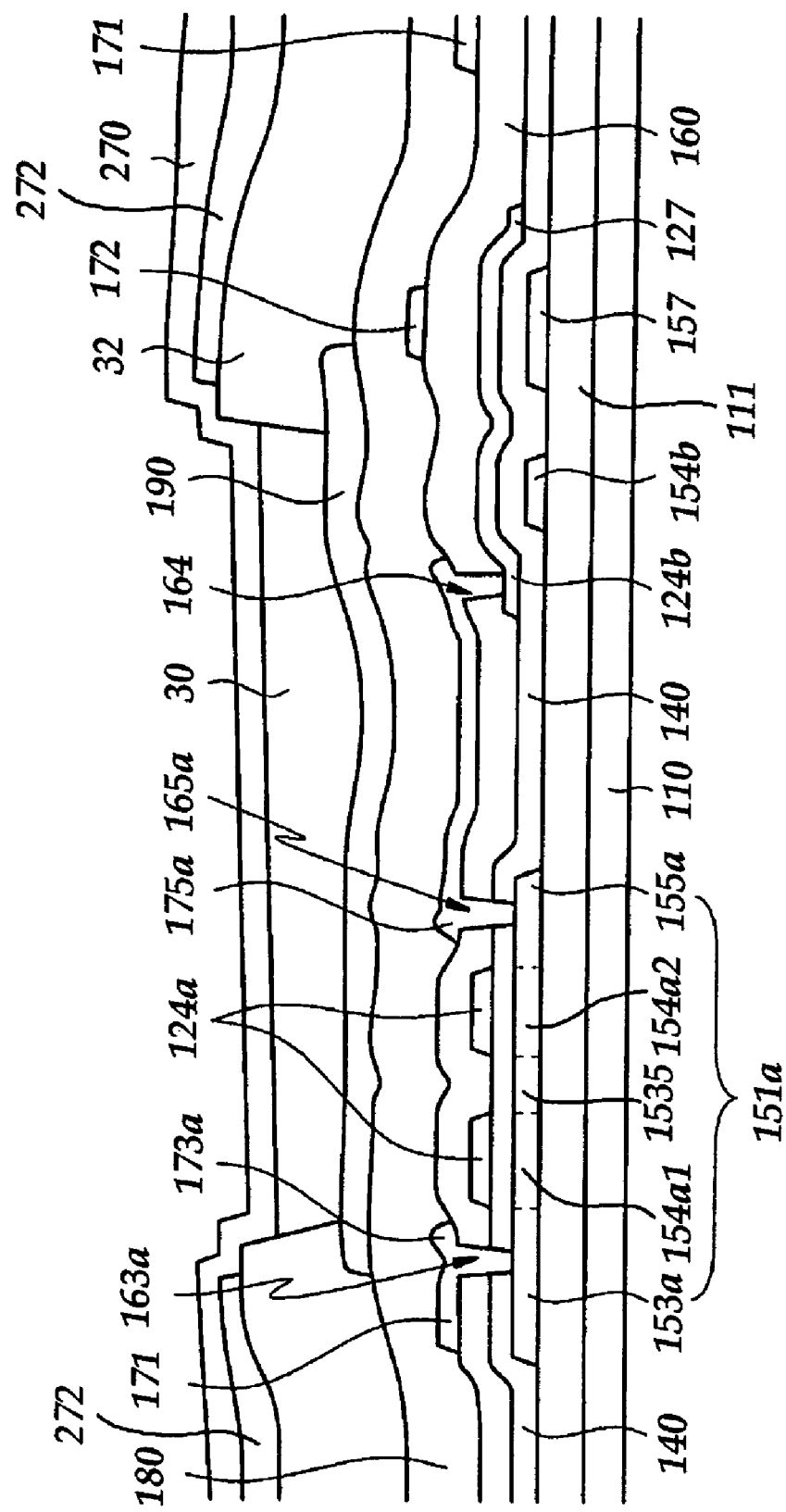
FIGS. 2 and 3 are sectional views of the OLED shown in FIG. 1 taken along the lines II-II' and III-III', respectively.
Figure 3:
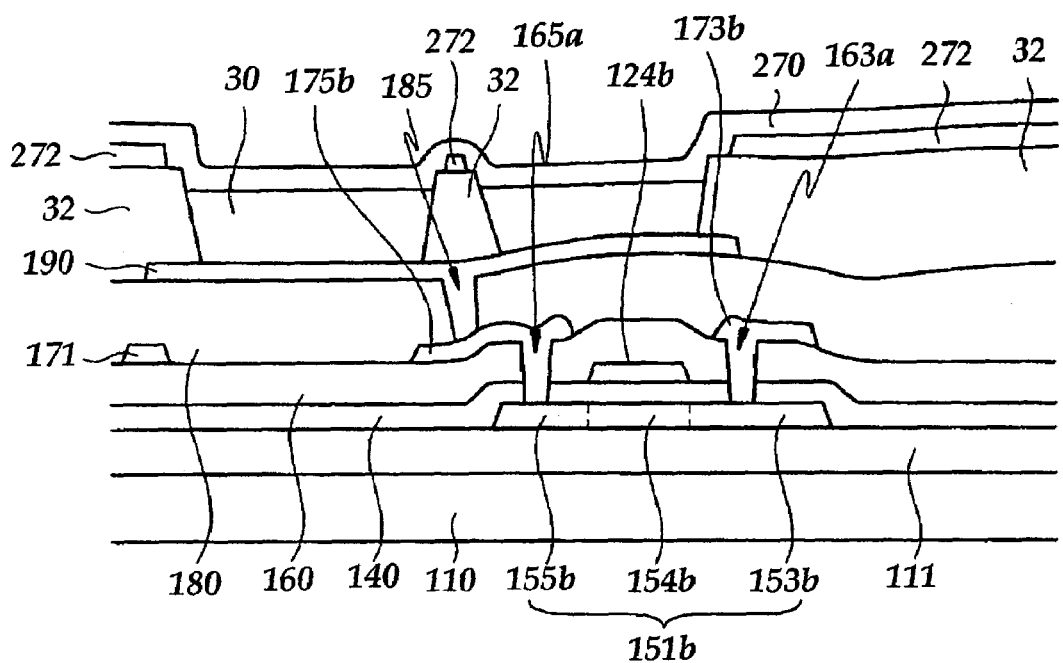

FIG. 1 is a layout view of an OLED according to an embodiment of the present invention, FIGS. 2 and 3 are sectional views of the OLED shown in FIG. 1 taken along the lines II-II' and III-III', respectively.

A blocking layer 111 preferably made of silicon oxide or silicon nitride is formed on an insulating substrate 110 preferably made of transparent glass. The blocking film 111 may have a dual-layered structure.

A plurality of semiconductor islands 151a and 151b preferably made of polysilicon are formed on the blocking film 111. Each of the semiconductor islands 151a and 151b includes a plurality of extrinsic regions containing N type or P type conductive impurity and at least one intrinsic region hardly containing conductive impurity.

Regarding a semiconductor island 151a for a switching TFT Qa, the extrinsic regions include a first source region 153a, an intermediate region 1535, and a first drain region 155a, which are doped with N type impurity and separated from one another, and the intrinsic regions include such as a pair of (first) channel regions 154a1 and 154a2 disposed between the extrinsic regions 153a, 1535 and 155a.

Concerning a semiconductor island 151b for a driving TFT Qb, the extrinsic regions include a second source region 153b and a second drain region 155b, which are doped with P type impurity and separated from one another, and the intrinsic region includes a channel region 154b disposed between the second source region 153b and the second drain region 155b. The second source region 153b extends to form a storage region 157.

The extrinsic regions may further include lightly doped regions (not shown) disposed between the channel regions 154a1, 154a2 and 154b and the source and the drain regions 153a, 155a, 153b and 155b. The lightly doped regions may be substituted with offset regions that contain substantially no impurity.

Alternatively, the extrinsic regions 153a and 155a of the first semiconductor islands 151a are doped with P type impurity, while the extrinsic regions 153b and 155b of the second semiconductor islands 151b are doped with N type impurity, depending on driving conditions. The conductive impurity includes P type impurity such as boron (B) and gallium (Ga) and N type impurity such as phosphorous (P) and arsenic (As).

A gate insulating layer 140 preferably made of silicon oxide or silicon nitride is formed on the semiconductor islands 151a and 151b and the blocking film 111.

A plurality of gate conductors including a plurality of gate lines 121 including a plurality of pairs of first gate electrodes 124a and a plurality of second gate electrodes 124b are formed on the gate insulating layer 140.

The gate lines 121 for transmitting gate signals extend substantially in a transverse direction. Each pair of first gate electrodes 124a protrude upward from the gate line 121 and they intersect the first semiconductor islands 151a such that they overlap the pair of the first channel regions 154a. Each gate line 121 may include an expanded end portion having a large area for contact with another layer or an external driving circuit. The gate lines 121 may be directly connected to a gate driving circuit for generating the gate signals, which may be integrated on the substrate 110.

The second gate electrodes 124b are separated from the gate lines 121 and intersect the second semiconductor islands 151b such that they overlap the second channel regions 154b. The second gate electrodes 124b extend to form storage electrodes 127 overlapping the storage electrode regions 157 of the second semiconductor islands 151b to form storage capacitors Cst.

The gate conductors 121 and 124b are preferably made of low resistivity material including Al containing metal such as Al and Al alloy (e.g. Al—Nd), Ag containing metal such as Ag and Ag alloy, and Cu containing metal such as Cu and Cu alloy. The gate conductors 121 and 124b may have a multi-layered structure including two films having different physical characteristics. One of the two films is preferably made of low resistivity metal including Al containing metal, Ag containing metal, and Cu containing metal for reducing signal delay or voltage drop in the gate conductors 121 and 124b. The other film is preferably made of material such as Cr, Mo and Mo alloy, Ta or Ti, which has good physical, chemical, and electrical contact characteristics with other materials such as indium tin oxide (ITO) or indium zinc oxide (IZO). Good examples of the combination of the two films are a lower Cr film and an upper Al—Nd alloy film and a lower Al film and an upper Mo film.

In addition, the lateral sides of the gate conductors 121 and 124b are inclined relative to a surface of the substrate 110, and the inclination angle thereof ranges about 30-80 degrees.

An interlayer insulating film 160 is formed on the gate conductors 121 and 124b. The interlayer insulating layer 160 is preferably made of photosensitive organic material having a good flatness characteristic, low dielectric insulating material such as a-Si:C:O and a-Si:O:F formed by plasma enhanced chemical vapor deposition (PECVD), or inorganic material such as silicon nitride and silicon oxide.

The interlayer insulating layer 160 has a plurality of contact holes 164 exposing the second gate electrodes 124b. In addition, the interlayer insulating layer 160 and the gate insulating layer 140 have a plurality of contact holes 163a, 163b, 165a and 165b exposing the source regions 153a and 153b and the drain regions 155a and 155b, respectively.

A plurality of data conductors including a plurality of data lines 171, a plurality of voltage transmission lines 172, and a plurality of first and second drain electrodes 175a and 175b are formed on the interlayer insulating film 160.

The data lines 171 for transmitting data signals extend substantially in the longitudinal direction and intersect the gate lines 121. Each data line 171 includes a plurality of first source electrodes 173a connected to the first source regions 153a through the contact holes 163a. Each data line 171 may include an expanded end portion having a large area for contact with another layer or an external driving circuit. The data lines 171 may be directly connected to a data driving circuit for generating the gate signals, which may be integrated on the substrate 110.

The voltage transmission lines 172 for transmitting driving voltages for the driving TFT Qb extend substantially in the longitudinal direction and intersect the gate lines 121. Each voltage transmission line 172 includes a plurality of second source electrodes 173b connected to the second source regions 153b through the contact holes 163b. The voltage transmission lines 171 may be connected to each other.

The first drain electrodes 175a are separated from the data lines 171 and the voltage transmission lines 172 and connected to the first drain regions 155a through the contact holes 165 and to the second gate electrodes 124b through the contact hole 164.

The second drain electrodes 175b are separated from the data lines 171 and the voltage transmission lines 172 and connected to the second drain regions 155b through the contact holes 165b.

The data conductors 171, 172, 175a and 175b are preferably made of refractory metal including Cr, Mo, Ti, Ta or alloys thereof. They may have a multi-layered structure preferably including a low resistivity film and a good contact film. A good example of the multi-layered structure includes a Mo lower film, an Al middle film, and a Mo upper film as well as the above-described combinations of a Cr lower film and an Al—Nd upper film and an Al lower film and a Mo upper film.

Like the gate conductors 121 and 124b, the data conductors 171, 172, 175a and 175b have tapered lateral sides relative to the surface of the substrate 110, and the inclination angles thereof range about 30-80 degrees.

A passivation layer 180 is formed on the data conductors 171, 172, 175a and 175b. The passivation layer 180 is also preferably made of photosensitive organic material having a good flatness characteristic, low dielectric insulating material such as a-Si:C:O and a-Si:O:F formed by PECVD, or inorganic material such as silicon nitride and silicon oxide.

The passivation layer 180 has a plurality of contact holes 185 exposing the second drain electrodes 175b. The passivation layer 180 may further has a plurality of contact holes (not shown) exposing end portions of the data lines 171 and the passivation layer 180 and the interlayer insulating layer 160 may have a plurality of contact holes (not shown) exposing end portions of the gate lines 121.

A plurality of pixel electrodes 190 are formed on the passivation layer 180. The pixel electrodes 190 are connected to the second drain electrodes 175b through the contact holes 185 and they are preferably made of at least one of reflective opaque material such as Al or Ag alloy. However, the pixel electrode 190 may be made of transparent conductor such as ITO or IZO and opaque reflective conductor such as Al, Ag, Ca, Ba and Mg. The pixel electrode 190 may be incorporated with the second drain electrode 175b for reducing the manufacturing cost.

A plurality of contact assistants or connecting members (not shown) may be also formed on the passivation layer 180 such that they are connected to the exposed end portions of the gate lines 121 or the data lines 171.

A partition 32 for separating pixels of the OLED is formed on the passivation layer 180 and the pixel electrodes 190.

The partition 32 surrounds the pixel electrodes 190 like a bank to define openings to be filled with organic light emitting material. The partition 32 is preferably made of organic or inorganic insulating material.

A plurality of light emitting members 30 are formed on the pixel electrodes 190 and disposed in the openings defined by the partition 32. The light emitting members 30 are preferably made of organic material emitting primary-color lights such as red, green and blue lights. The red, green and blue light emitting members 30 are periodically arranged.

An auxiliary electrode 272 preferably made of low resistivity material such as metal is formed on the partition 32. The auxiliary electrode 272 has substantially the same planar shape as the partition 32.

A common electrode 270 supplied with a predetermined voltage such as a common voltage is formed on the light emitting members 30, the auxiliary electrode 272, and the partition 32. The common electrode 270 is preferably made of transparent conductive material such as ITO and IZO or opaque metal such as Al, Ag, Ca, Ba and Mg. The common electrode 270 contacts the auxiliary electrode 272 such that the auxiliary electrode 272 compensates the conductivity of the common electrode 270 and prevents the distortion of the signals transmitted to the common electrode 270.

In the above-described OLED, a first semiconductor island 151a, a first gate electrode 124a connected to the gate line 121, a first source electrode 153a connected to the data line 171, and a first drain electrode 155a form a switching TFT Qa. In addition, a second semiconductor island 151b, a second gate electrode 124b connected to the first drain electrode 155a, a second source electrode 153b connected to the voltage transmission line 172, and a second drain electrode 155b connected to a pixel electrode 190 form a driving TFT Qb. Furthermore, a pixel electrode 190 and a common electrode 270 serve as an anode and a cathode, respectively, and a storage region 157 connected to a first drain region 155a and a storage electrode 127 connected to a voltage transmission line 172 through a second source electrode 153b form a storage capacitor Cst. The TFTs Qa and Qb shown in FIGS. 1-3 are referred to as "top gate TFTs" since the gate electrodes 124a and 124b are disposed on the semiconductors 151a and 151b.

The switching TFT Qa transmits data signals from the data line 171 to the driving TFT Qb in response to the gate signal from the gate line 121. Upon the receipt of the data signal, the driving TFT Qb generates a current having a magnitude depending on the voltage difference between the second gate electrode 124b and the second source electrode 173b. In addition, the voltage difference is charged in the storage capacitor Cst to be maintained after the switching TFT Qa is turned off. The current driven by the driving TFT Qb enters into the light emitting member 30 through the pixel electrode 190 and reaches the common electrode 270. The current flowing in the light emitting member 30 means that positive charge carriers such as holes and negative charge carriers such as electrons are injected into the light emitting member 30 from the anode 190 and the cathode 270, respectively, and they are drifted by an electric field generated by the voltage difference between the anode 190 and the cathode 270. The holes and the electrons in the light emitting member 30 then meet each other to be recombined into excitons, which emit light with a predetermined wavelength. The intensity of the emitted light depends on the current driven by the driving TFT Qb and flowing in the light emitting member 30.

The emitted light goes out of the display panel after passing through the common electrode 270 or the pixel electrode 190. A transparent common electrode 270 and an opaque pixel electrode 190 are applicable to a top emission type OLED, which displays an image on its top surface. On the contrary, a transparent pixel electrode 190 and an opaque common electrode 270 are applicable to a bottom emission type OLED, which displays an image on its bottom surface.

Now, a method of manufacturing the OLED shown in FIGS. 1-3 is described with reference to FIGS. 11-24B as well as FIGS. 1-3.

Figure 4:
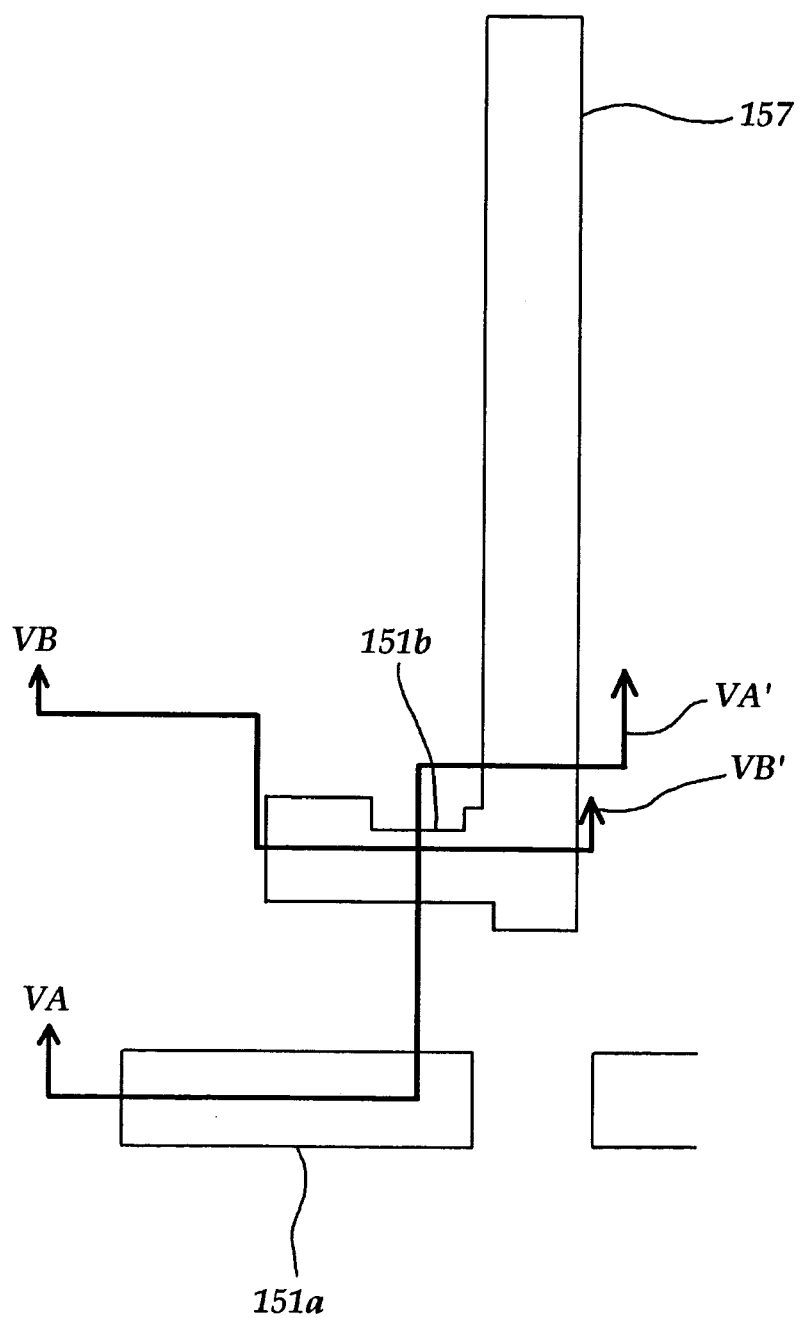
FIGS. 4, 6, 8, 10, 12, 14, 16 and 18 are layout views of the OLED shown in FIGS. 1-3 in intermediate steps of a manufacturing method thereof according to an embodiment of the present invention.
Figure 5A:
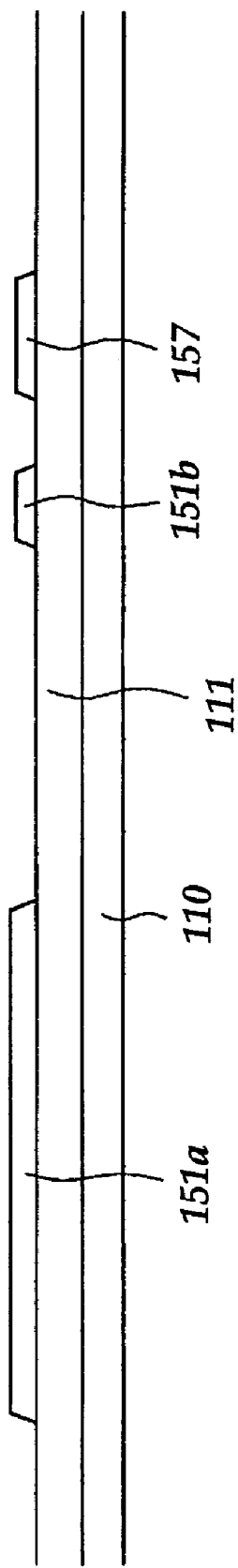
FIGS. 5A and 5B are sectional views of the OLED shown in FIG. 4 taken along the lines VA-VA' and VB-VB', respectively.
Figure 5B:
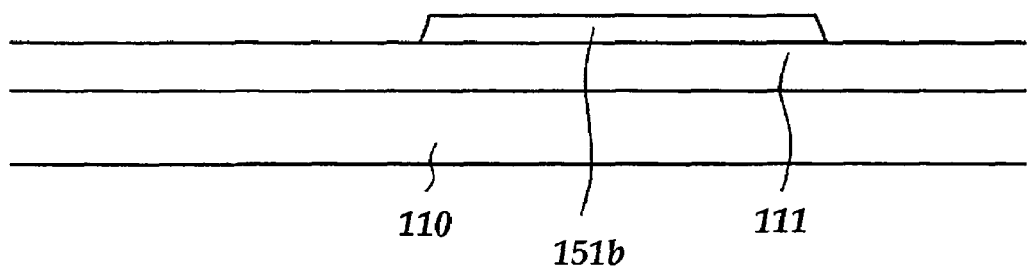
Figure 6:
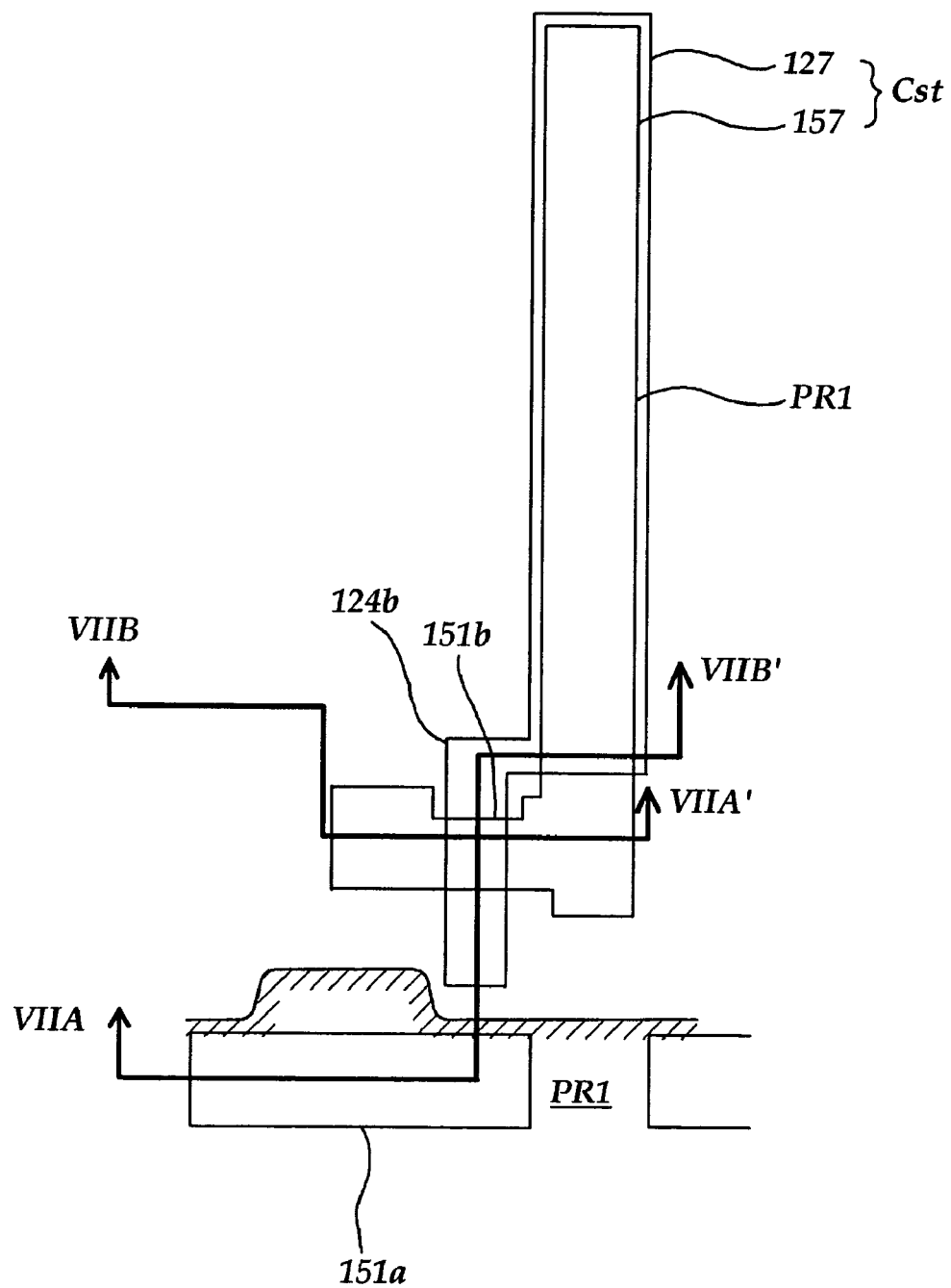
Figure 7A:
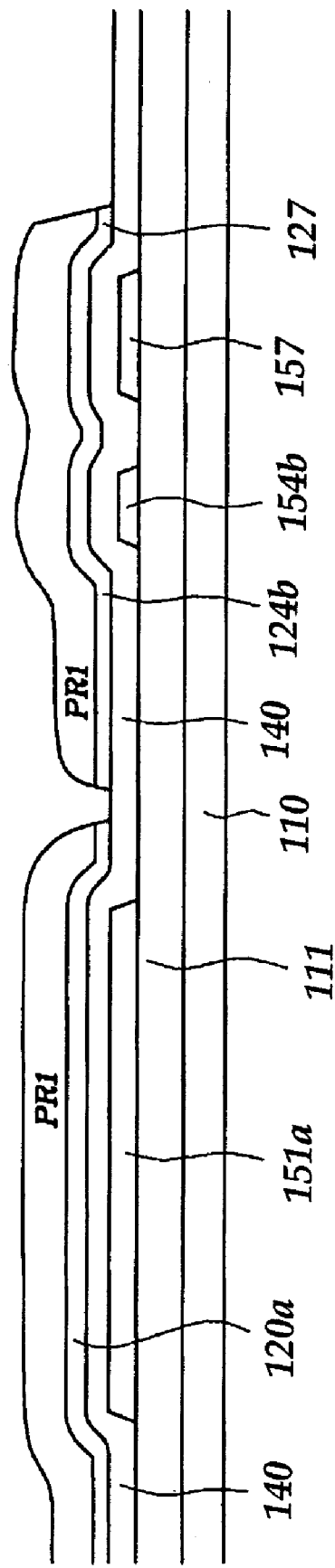
FIGS. 7A and 7B are sectional views of the OLED shown in FIG. 6 taken along the lines VIIA-VIIA' and VIIB-VIIB', respectively.
Figure 7B:
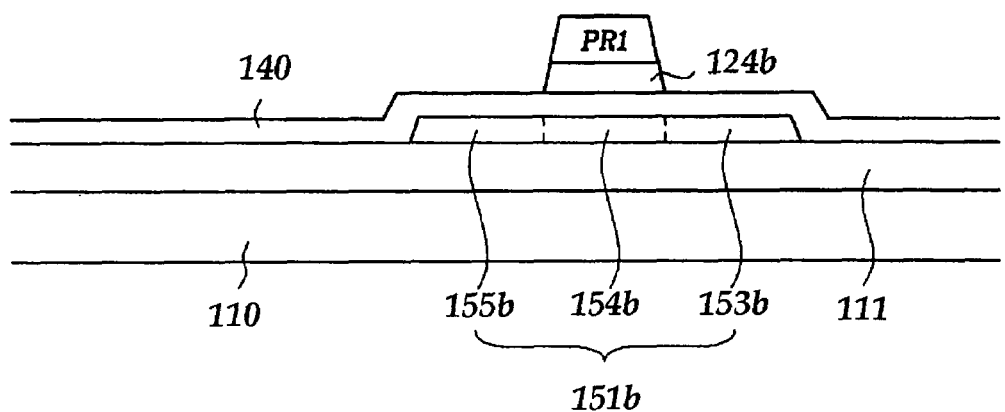
Figure 8:
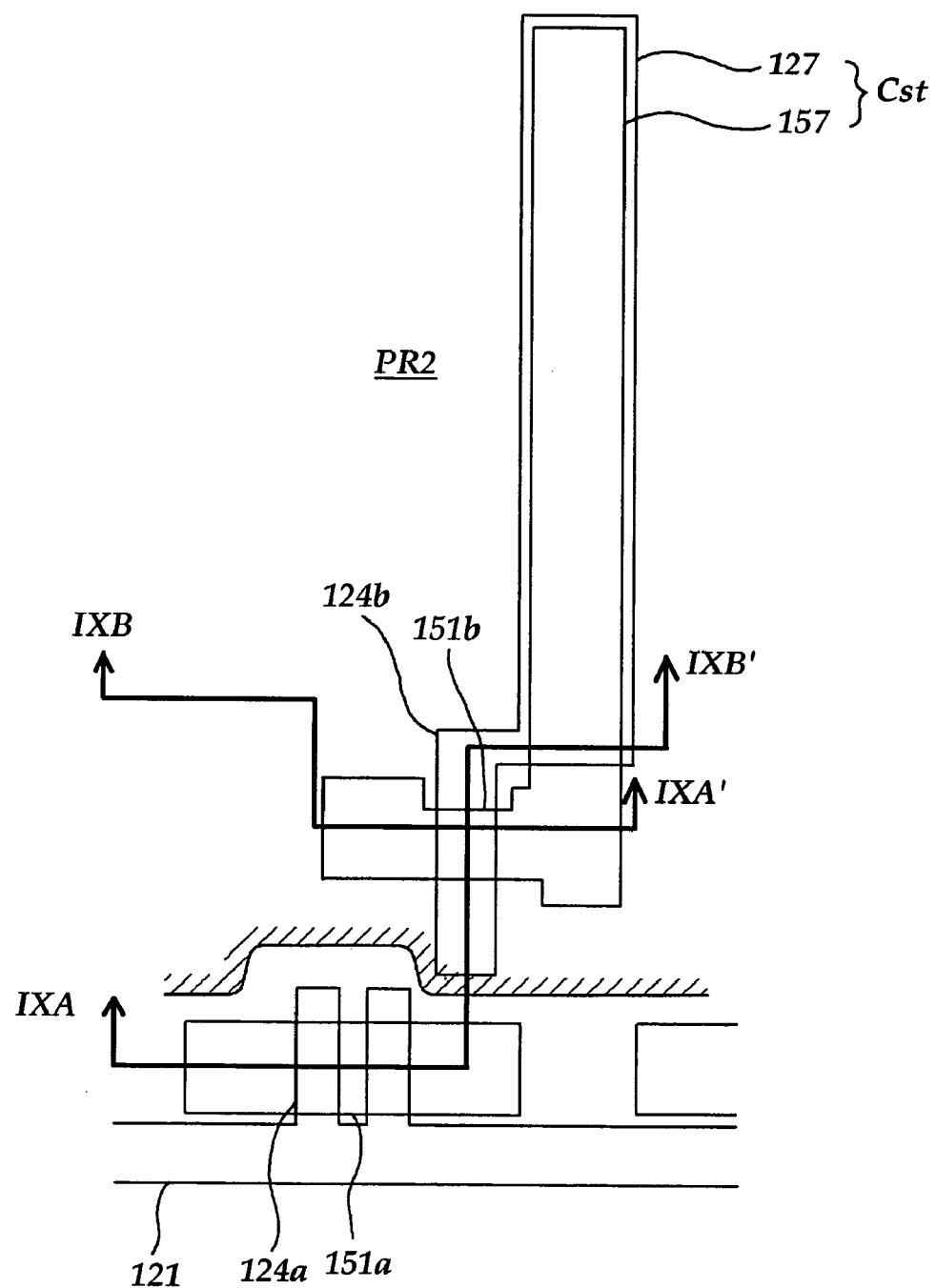
Figure 9A:
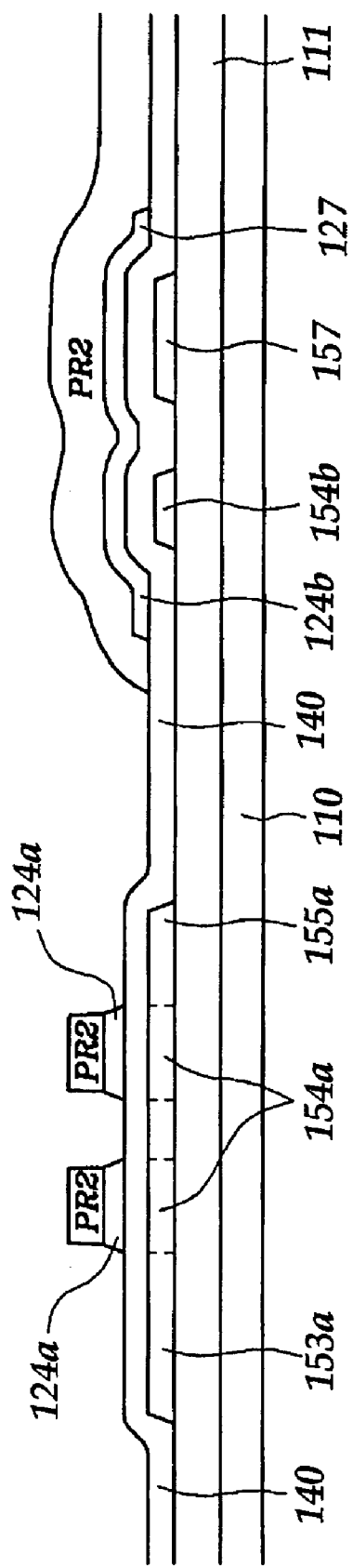
FIGS. 9A and 9B are sectional views of the OLED shown in FIG. 8 taken along the lines IXA-IXA' and IXB-IXB', respectively.
Figure 9B:
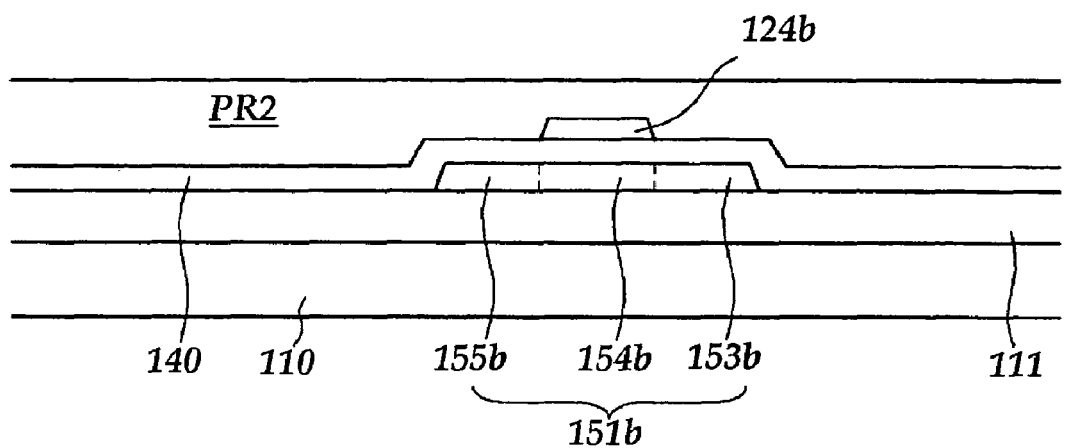
Figure 10:
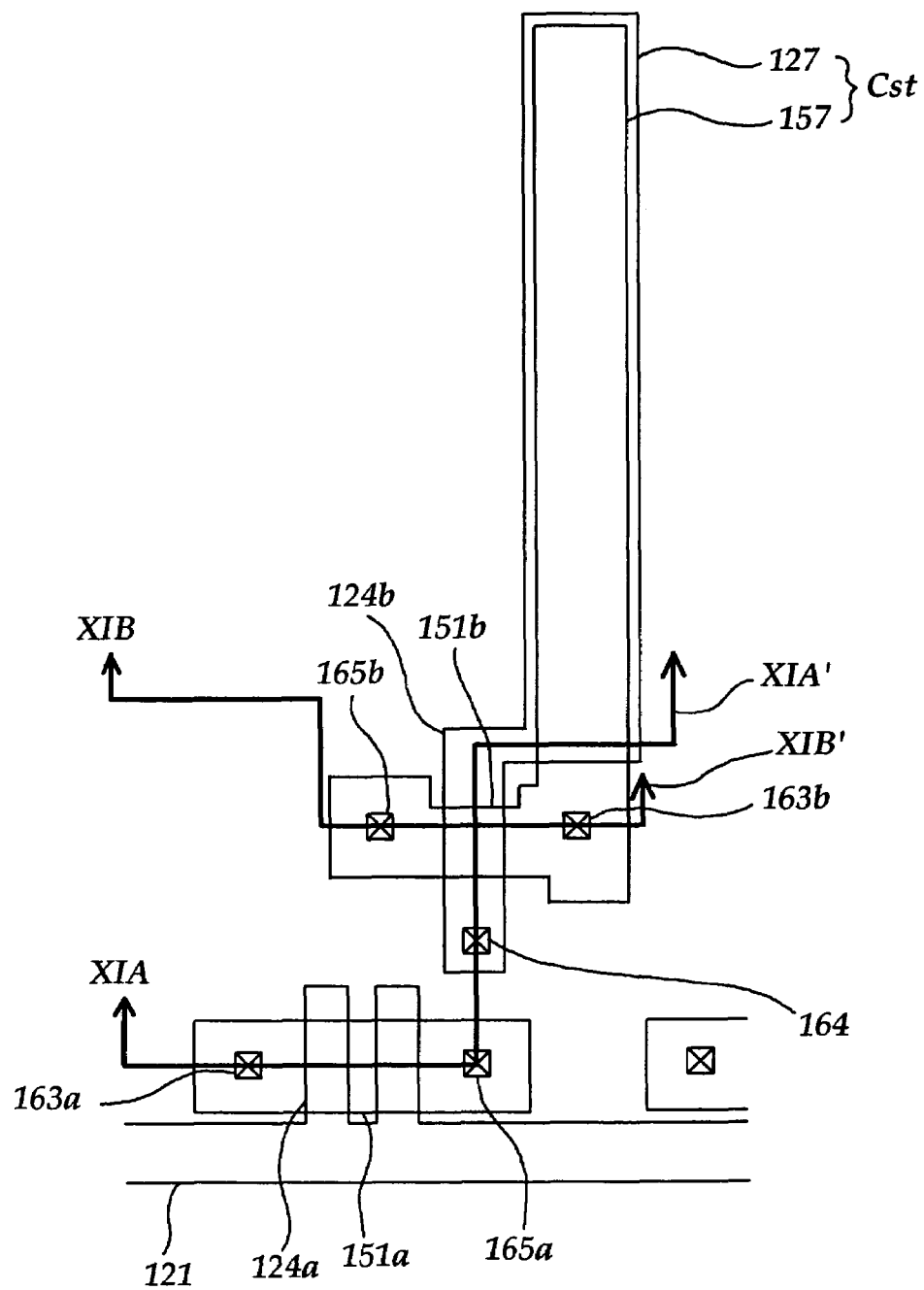
Figure 11A:
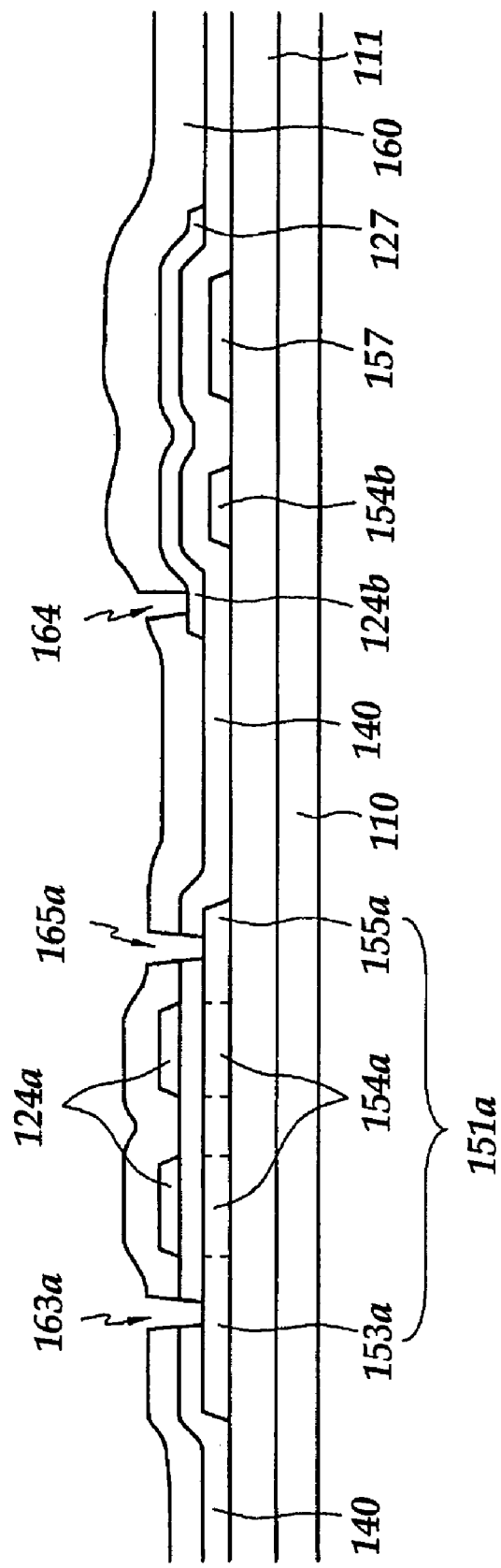
FIGS. 11A and 11B are sectional views of the OLED shown in FIG. 10 taken along the lines XIA-XIA' and XIB-XIB', respectively.
Figure 11B:
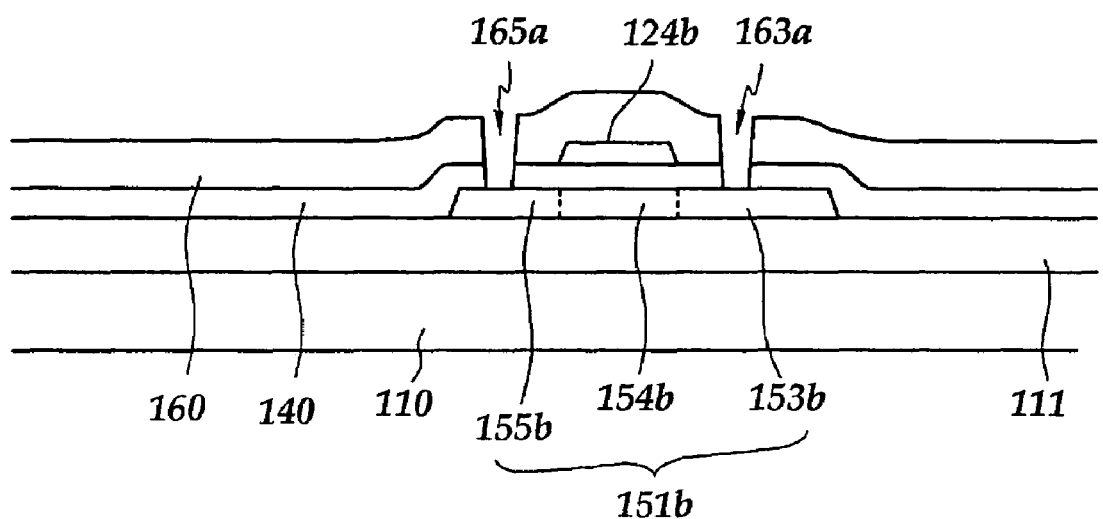
Figure 12:
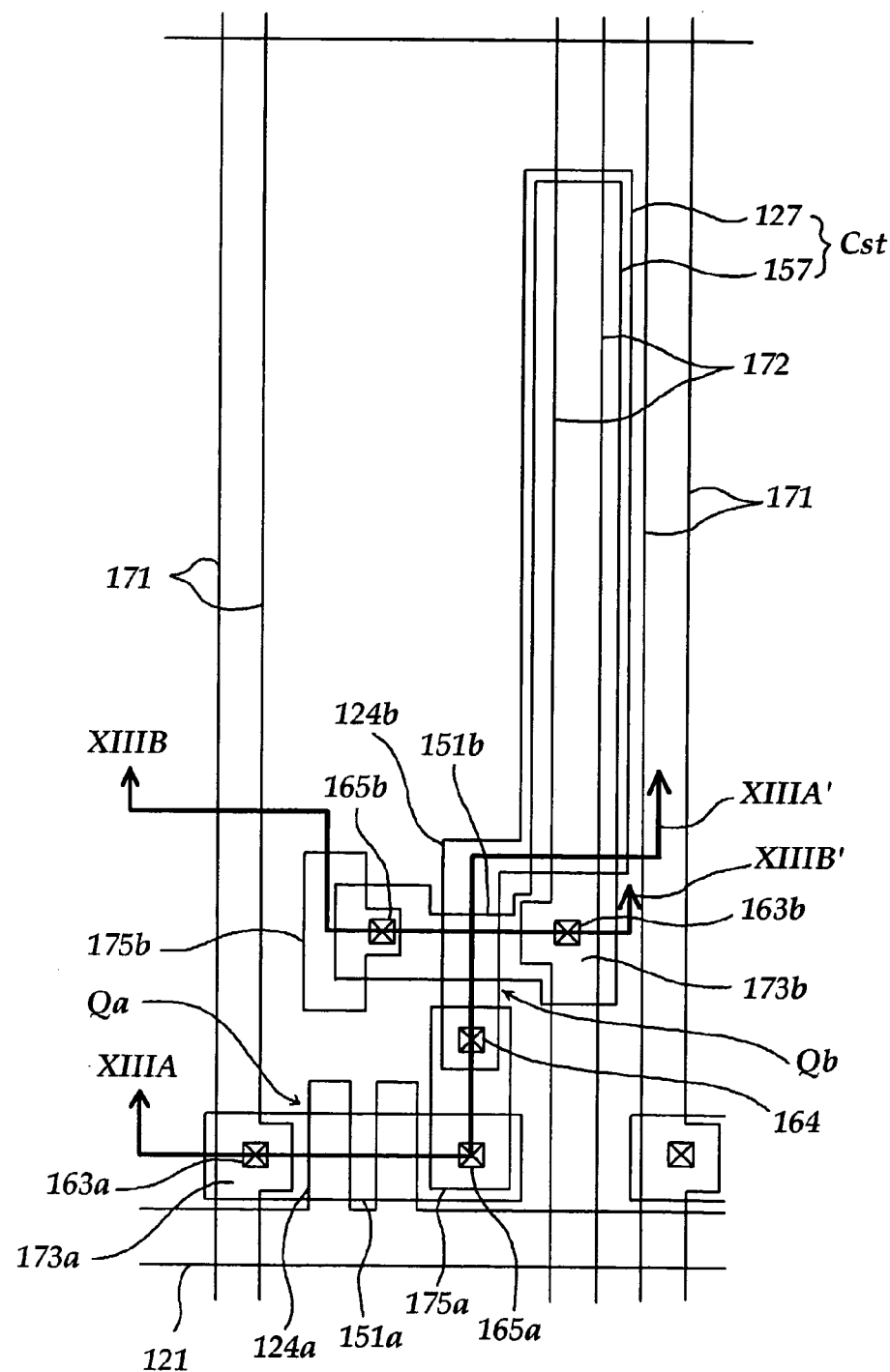
Figure 13A:
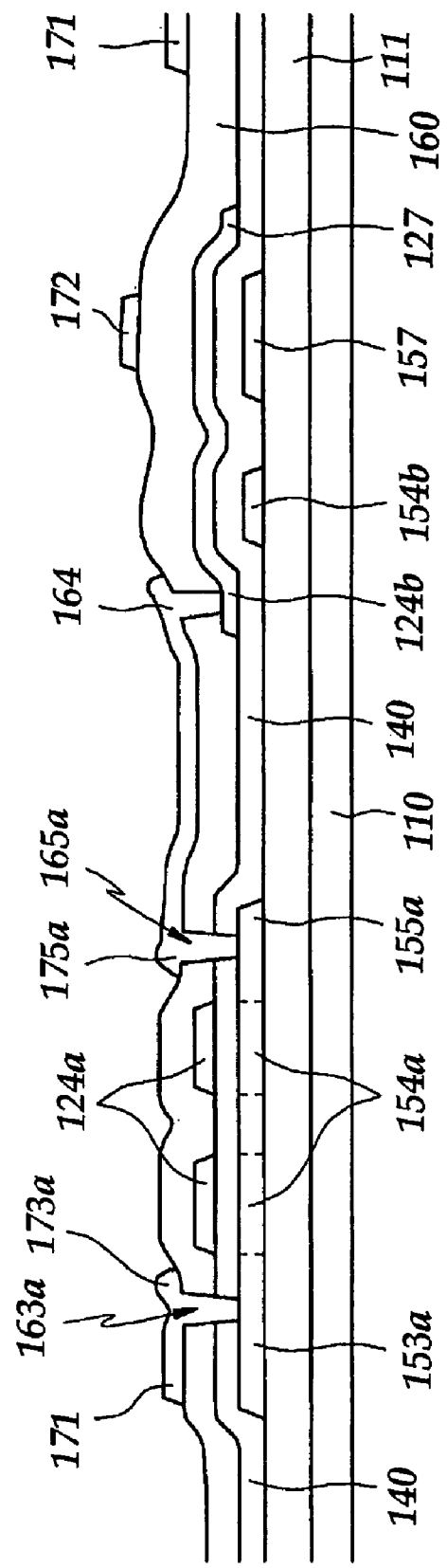
FIGS. 13A and 13B are sectional views of the OLED shown in FIG. 12 taken along the lines XIIIA-XIIIA' and XIIIB-XIIIB', respectively.
Figure 13B:
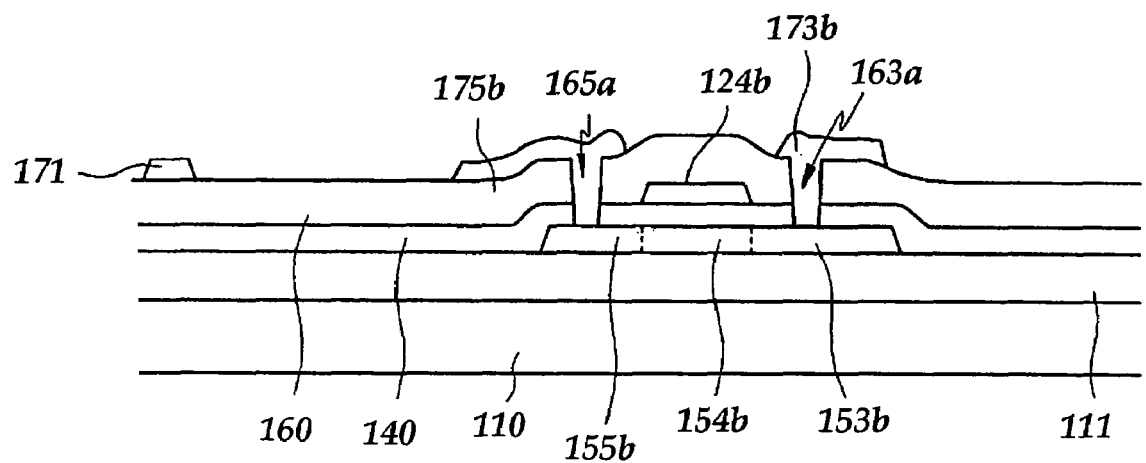
Figure 14:
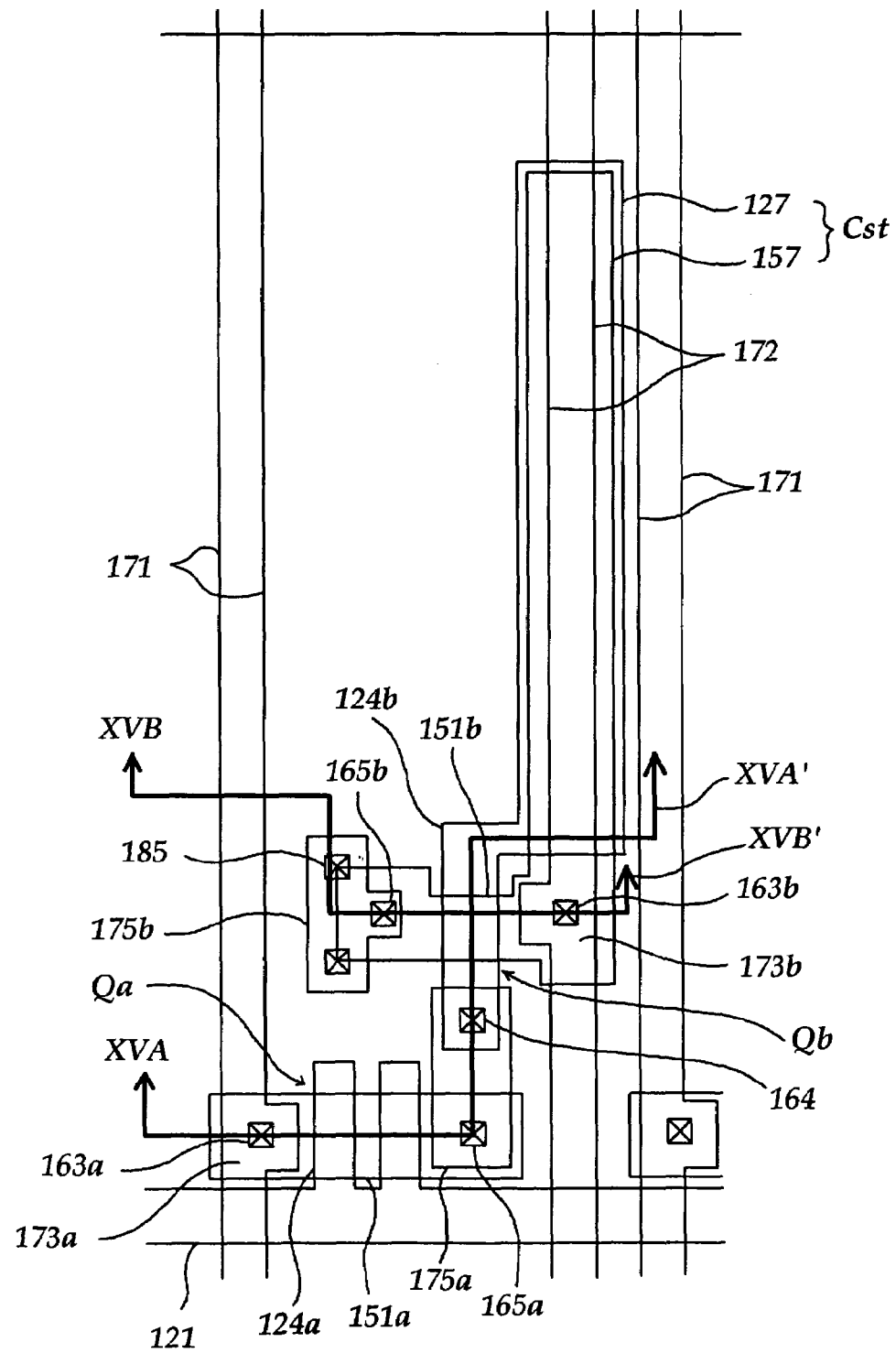
Figure 15A:
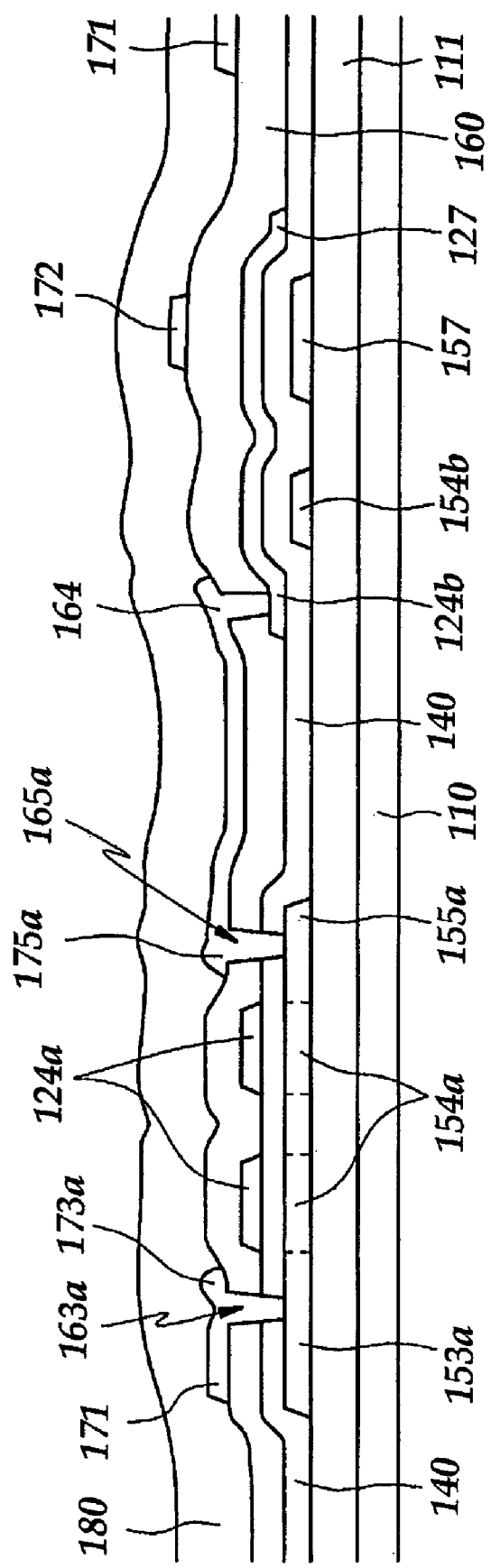
FIGS. 15A and 15B are sectional views of the OLED shown in FIG. 14 taken along the lines XVA-XVA' and XVB-XVB', respectively.
Figure 15B:
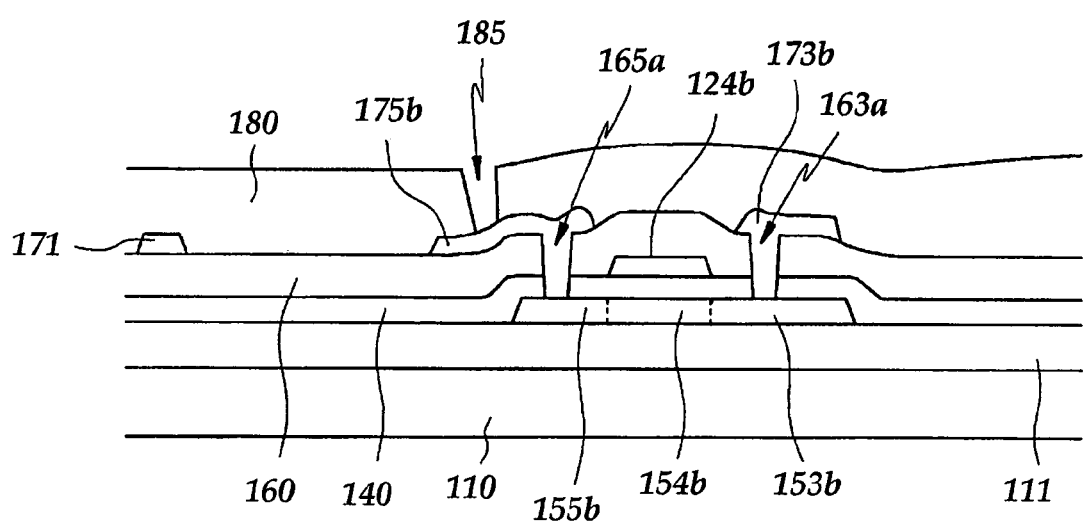
Figure 16:
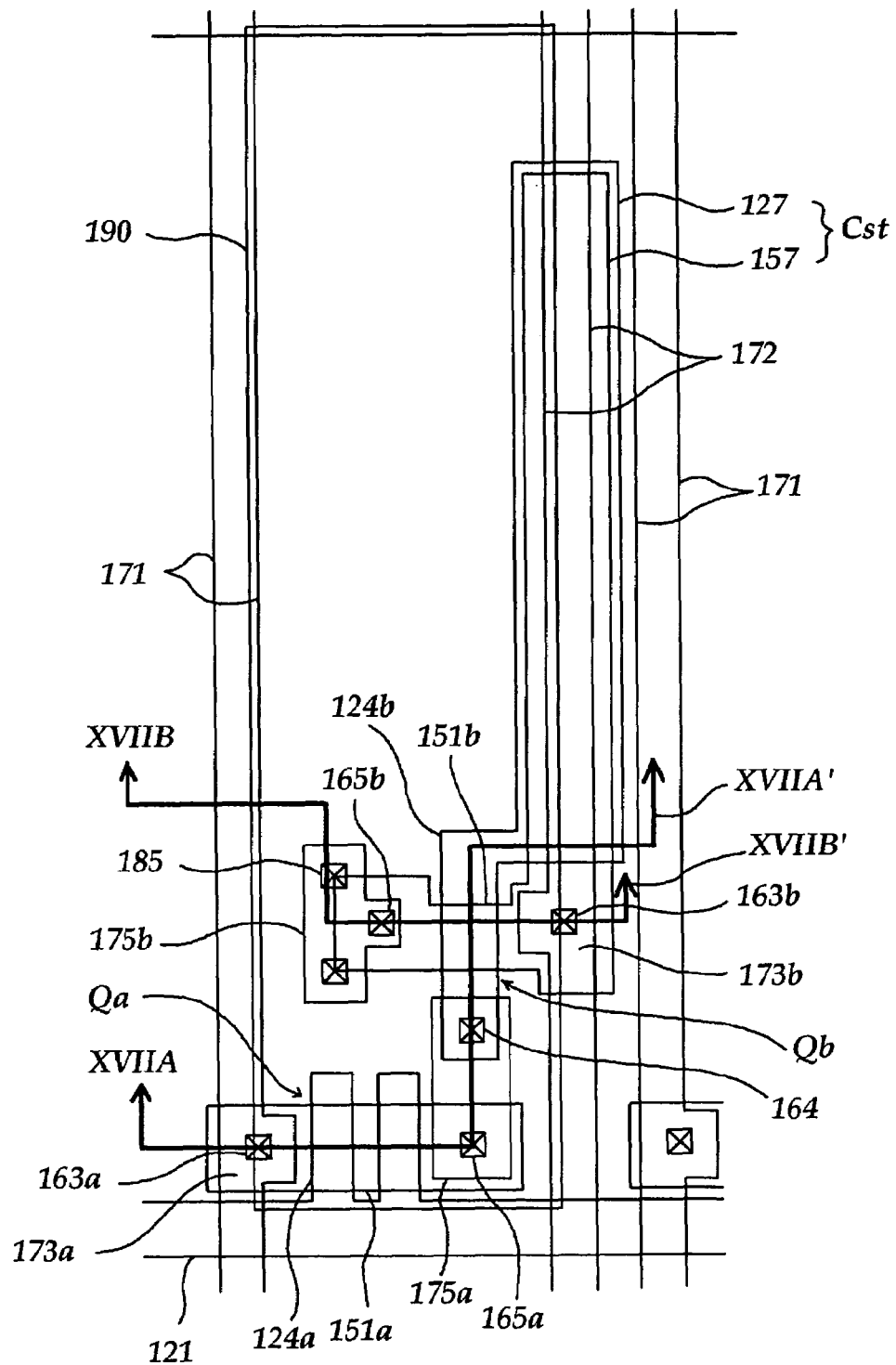
Figure 17A:
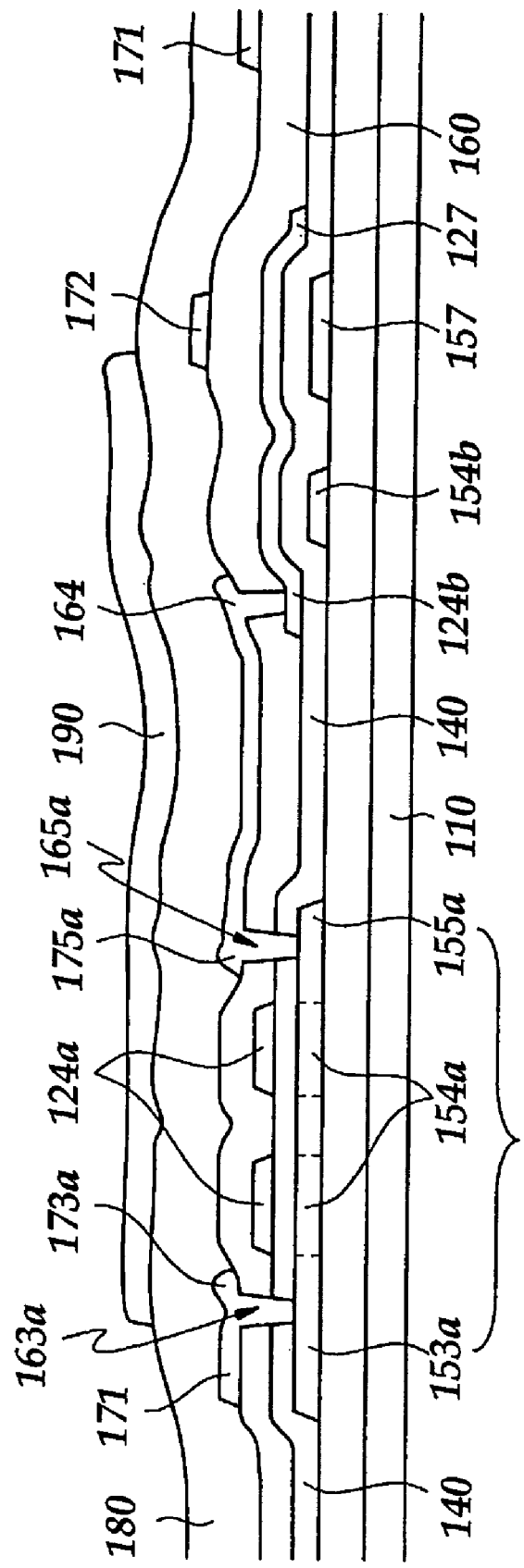
FIGS. 17A and 17B are sectional views of the OLED shown in FIG. 16 taken along the lines XVIIA-XVIIA' and XVIIB-XVIIB', respectively.
Figure 17B:
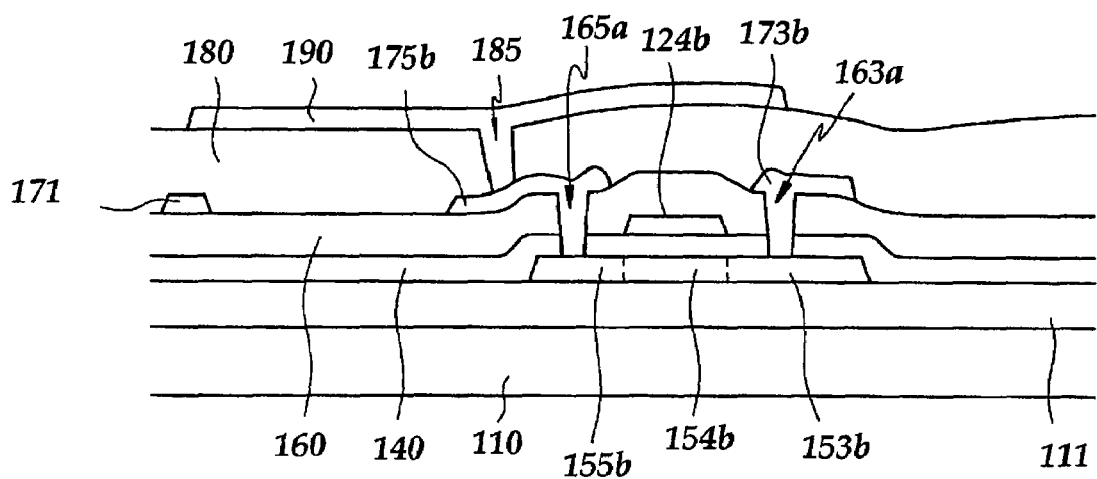
Figure 18:
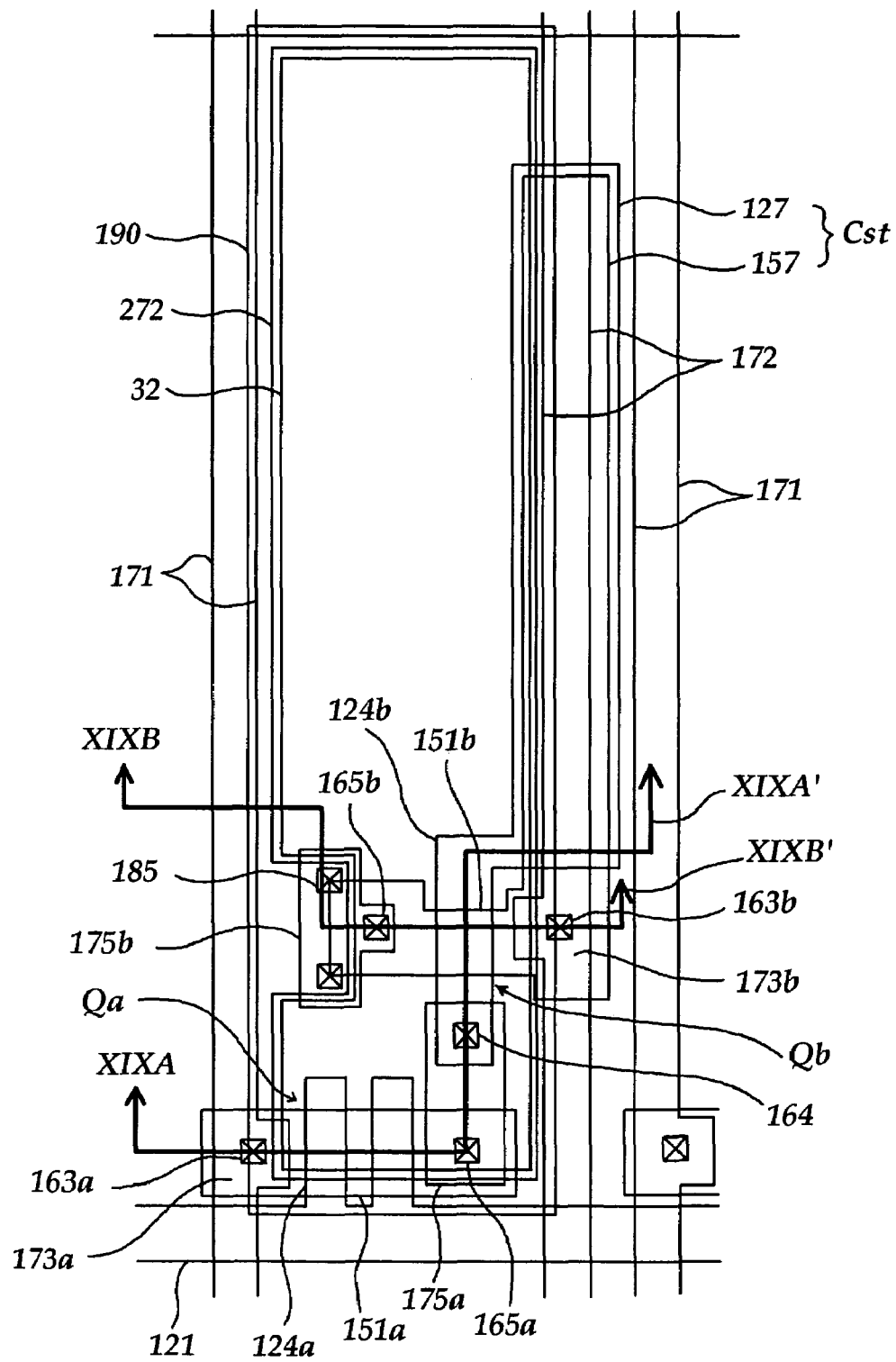
Figure 19A:
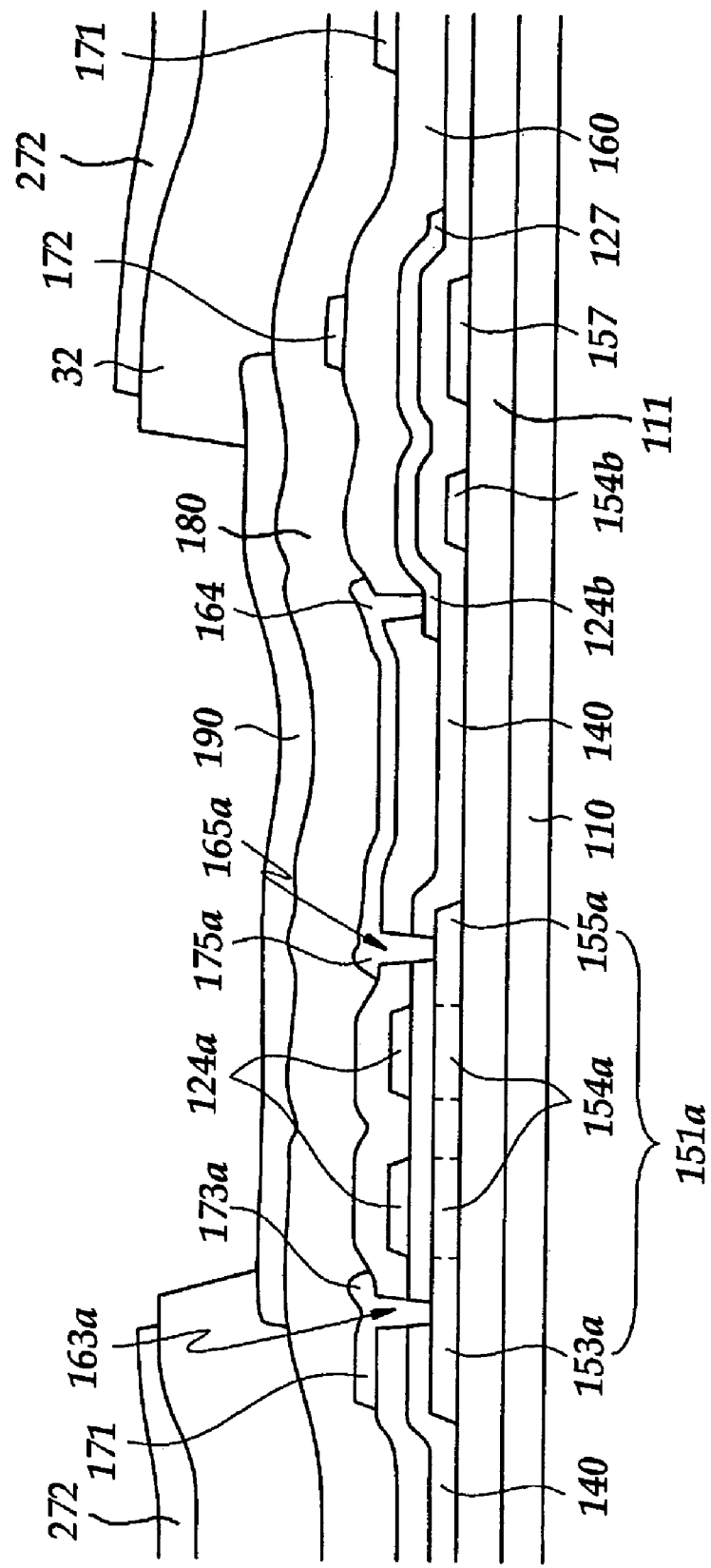
FIGS. 19A and 19B are sectional views of the OLED shown in FIG. 18 taken along the lines XIXA-XIXA' and XIXB-XIXB', respectively.
Figure 19B:
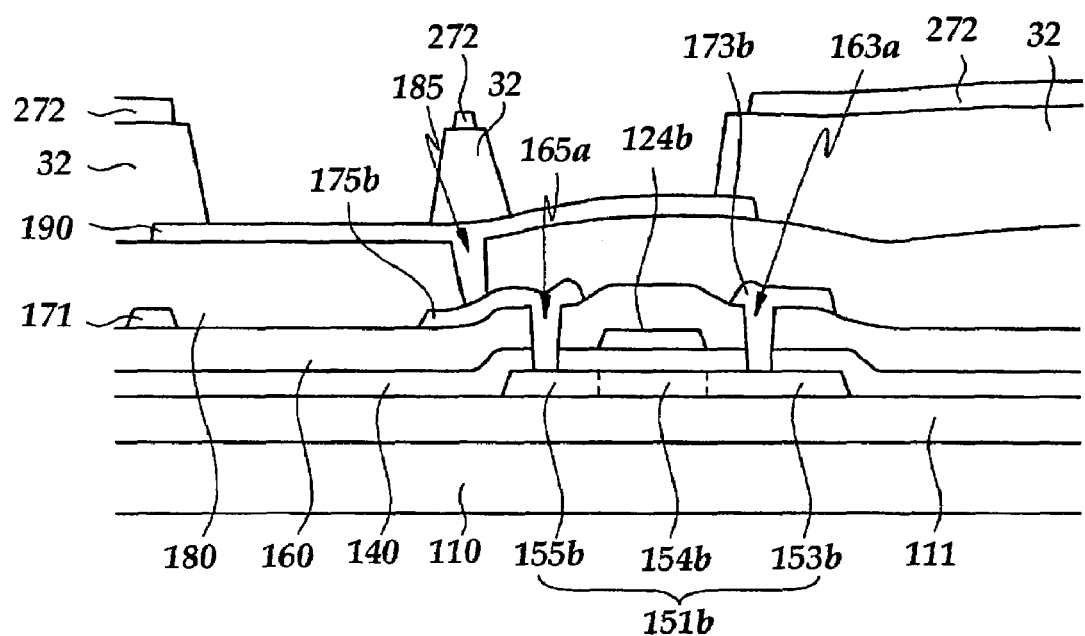
Figure 20A:
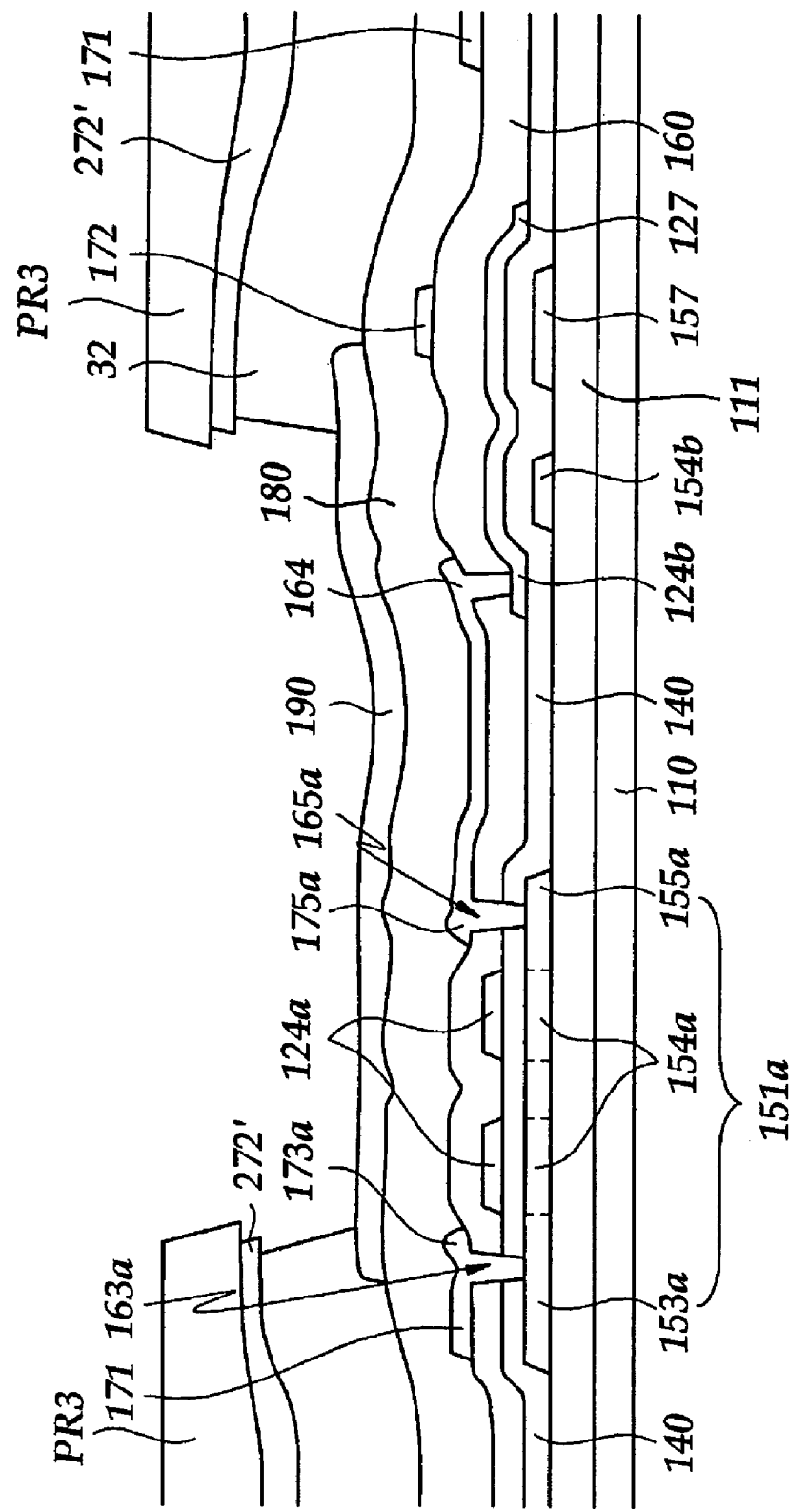
FIGS. 20A and 20B are sectional views of the OLED shown in FIG. 18 taken along the lines XIXA-XIXA' and XIXB-XIXB', respectively, and illustrate the first step of forming the structure shown in FIGS. 19A and 19B.
Figure 20B:
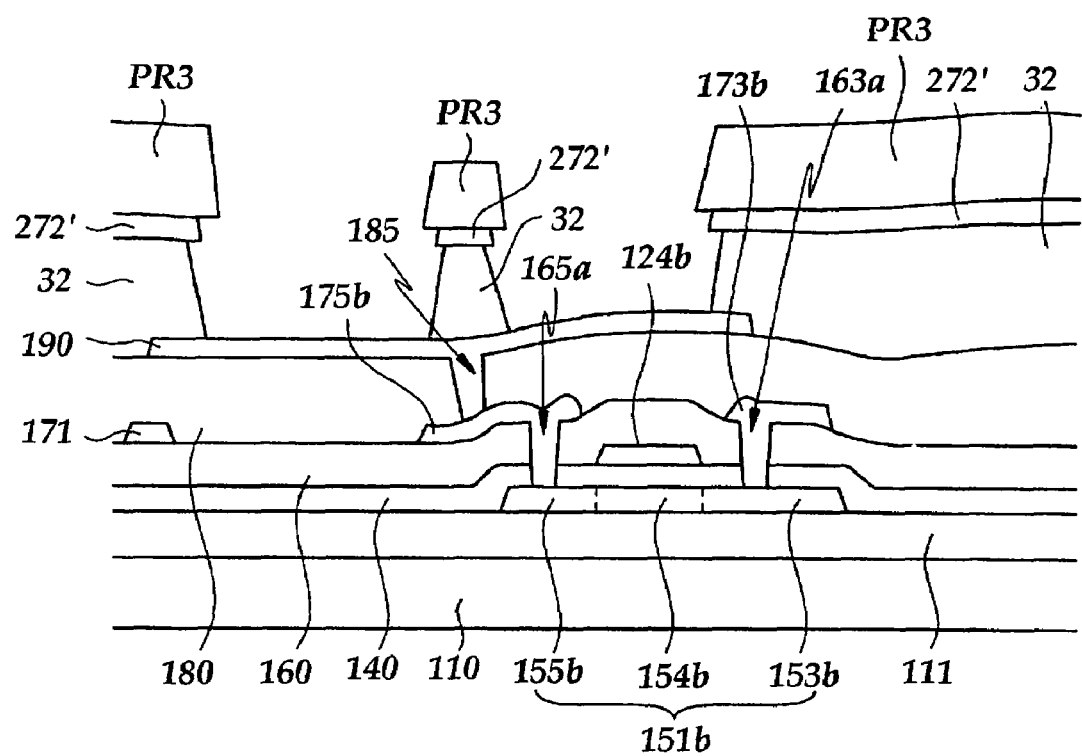
Figure 21A:
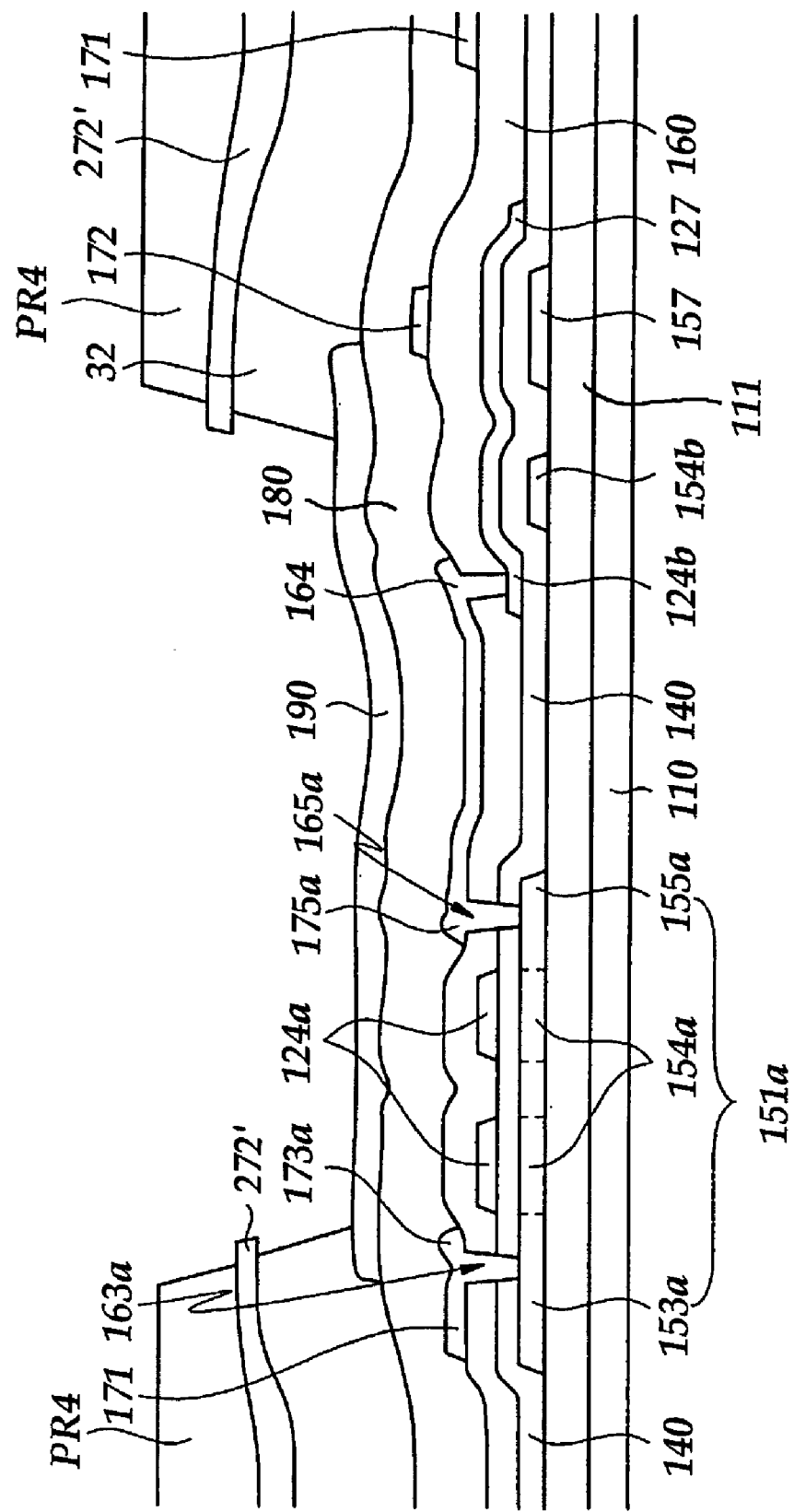
FIGS. 21A and 21B are sectional views of the OLED shown in FIG. 18 taken along the lines XIXA-XIXA' and XIXB-XIXB', respectively, and illustrate the step following the step shown in FIGS. 20A and 20B.
Figure 21B:
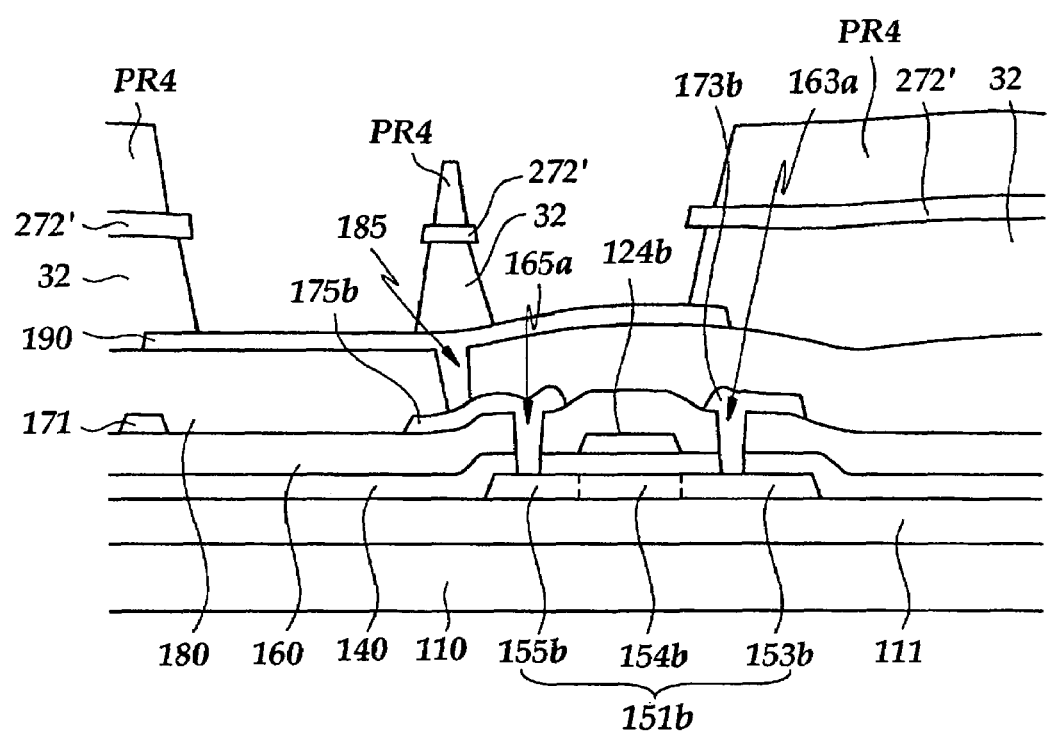
Figure 22B:
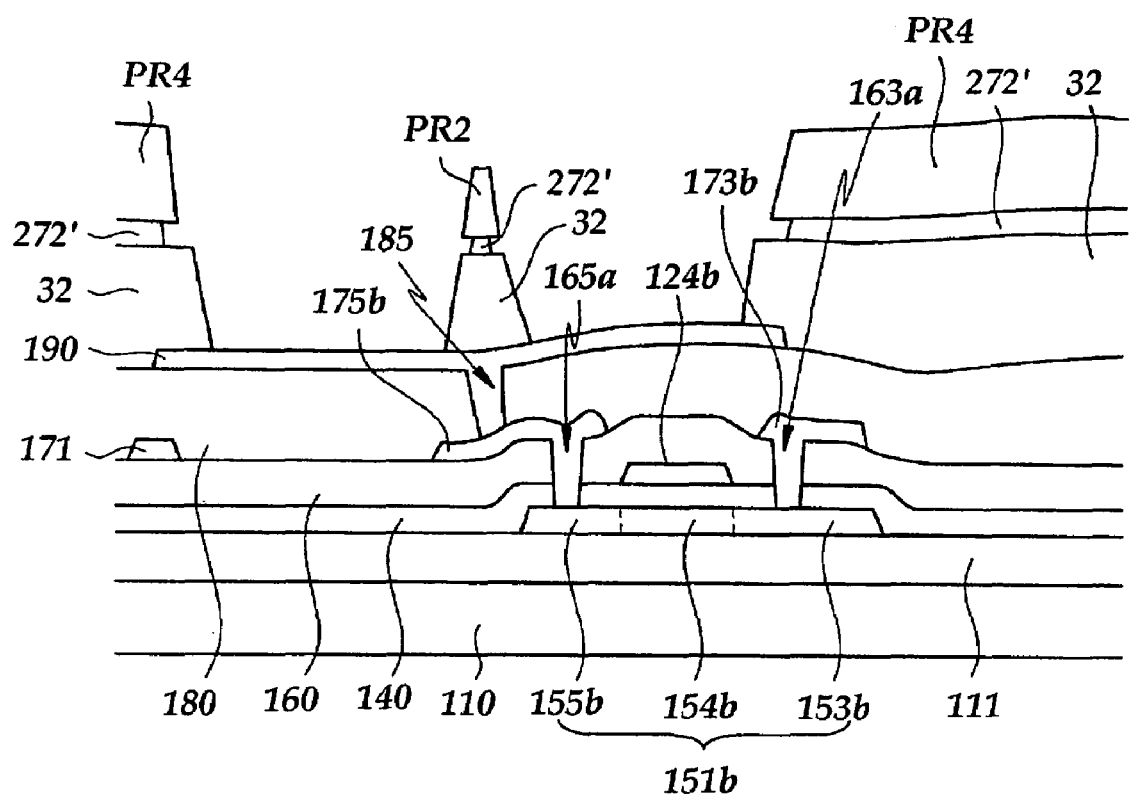

FIGS. 4, 6, 8, 10, 12, 14, 16 and 18 are layout views of the OLED shown in FIGS. 1-3 in intermediate steps of a manufacturing method thereof according to an embodiment of the present invention, FIGS. 5A and 5B are sectional views of the OLED shown in FIG. 4 taken along the lines VA-VA' and VB-VB', respectively, FIGS. 7A and 7B are sectional views of the OLED shown in FIG. 6 taken along the lines VIIA-VIIA' and VIIB-VIIB', respectively, FIGS. 9A and 9B are sectional views of the OLED shown in FIG. 8 taken along the lines IXA-IXA' and IXB-IXB', respectively, FIGS. 11A and 11B are sectional views of the OLED shown in FIG. 10 taken along the lines XIA-XIA' and XIB-XIB', respectively, FIGS. 13A and 13B are sectional views of the OLED shown in FIG. 12 taken along the lines XIIIA-XIIIA' and XIIIB-XIIIB', respectively, FIGS. 15A and 15B are sectional views of the OLED shown in FIG. 14 taken along the lines XVA-XVA' and XVB-XVB', respectively, FIGS. 17A and 17B are sectional views of the OLED shown in FIG. 16 taken along the lines XVIIA-XVIIA' and XVIIB-XVIIB', respectively, FIGS. 19A and 19B are sectional views of the OLED shown in FIG. 18 taken along the lines XIXA-XIXA' and XIXB-XIXB', respectively, FIGS. 20A and 20B are sectional views of the OLED shown in FIG. 18 taken along the lines XIXA-XIXA' and XIXB-XIXB', respectively, and illustrate the first step of forming the structure shown in FIGS. 19A and 19B; FIGS. 21A and 21B are sectional views of the OLED shown in FIG. 18 taken along the lines XIXA-XIXA' and XIXB-XIXB', respectively, and illustrate the step following the step shown in FIGS. 20A and 20B; and FIGS. 22A and 22B are sectional views of the OLED shown in FIG. 18 taken along the lines XIXA-XIXA' and XIXB-XIXB', respectively, and illustrate the step following the step shown in FIGS. 21A and 21B.

A blocking layer 111 is formed on an insulating substrate 110, and a semiconductor layer made of amorphous silicon is deposited on the blocking layer 111 preferably by LPCVD (low temperature chemical vapor deposition), PECVD (plasma enhanced chemical vapor deposition) or sputtering.

Next, the semiconductor layer is crystallized into polysilicon and photo-etched to form a plurality of pairs of first and second semiconductor islands 151a and 151b as shown in FIGS. 4-5B.

Referring to FIGS. 6-7B, a gate insulating layer 140 and a gate metal layer are sequentially deposited on the gate insulating layer 140 and a first photoresist PR1 is formed thereon. The gate metal layer is etched by using the first photoresist PR1 as an etch mask to form a plurality of gate electrodes 124b including storage electrodes 127 and a plurality of gate metal members 120a. P type impurity is introduced into portions of the second semiconductor islands 151b, which are not covered with the gate electrodes 124b and the gate metal members 120a as well as the first photoresist PR1, to form a plurality of P type extrinsic regions 153b and 155b. At this time, the first semiconductor islands 151a are covered with the first photoresist PR1 and the gate metal members 120a to be protected from impurity implantation.

Referring to FIGS. 8-9B, the first photoresist PR1 is removed and a second photoresist PR2 is formed. The gate metal members 120a is etched by using the second photoresist PR2 as an etch mask to form a plurality of gate lines 121 including gate electrodes 124a. N type impurity is injected into portions of the first semiconductor islands 151a, which are not covered with the gate lines 121 and the gate electrodes 124b as well as the second photoresist PR2, to form a plurality of N type extrinsic regions 153a and 155a. At this time, the second semiconductor islands 151b are covered with the second photoresist PR2 to be protected from impurity implantation.

Referring to FIGS. 10-11B, an interlayer insulating film 160 is deposited and the interlayer insulating film 160 and the gate insulating layer 140 are photo-etched form a plurality of contact holes 163a, 163b, 165a and 165b exposing the extrinsic regions 153a, 155a, 153b and 155b, respectively, as well as a plurality of contact holes 164 exposing the gate electrodes 124b.

Referring to FIGS. 12-13B, a plurality of data conductors including a plurality of data lines 171 including first source electrodes 173a, a plurality of voltage transmission line 172, a plurality of first and second drain electrodes 175a and 175b are formed on the interlayer insulating layer 160.

Referring to FIGS. 14-15B, a passivation layer 180 is deposited and is photo-etched to form a plurality of contact holes 185 exposing the second drain electrodes 175b.

Referring to FIGS. 16-17B, a plurality of pixel electrodes 190 are formed on the passivation layer 180. When the pixel electrodes 190 are made of reflective opaque material, they may be formed of the data metal layer along with the data lines 171.

Referring to FIGS. 18-19B, an insulating layer and a conductive layer are sequentially deposited and patterned to form a partition 32 and an auxiliary electrode 272, respectively, using a single photolithography such that the partition 32 and the auxiliary electrode 272 have substantially the same planar shape, which will be described in detail with reference to FIGS. 20A-22B.

Referring to FIGS. 20A and 20B, an insulating layer and a conductive layer are sequentially deposited and a third photoresist PR3 is formed on the conductive layer. The conductive layer is etched by using the third photoresist PR3 as an etch mask to form a pre-electrode 272' and the insulating layer is etched to form a partition 32. The etch of the conductive layer and the insulating layer generates undercut such that edges of the pre-electrode 272' are located under the third photoresist PR3 and edges of the partition 32 are located under the pre-electrode 272'.

Referring to FIGS. 21A and 21B, the third photoresist PR3 is subjected to ashing to form a fourth photoresist PR4 having edges disposed on the pre-electrode 272' such that edge portions of the pre-electrode 272' are exposed.

Referring to FIGS. 22A and 22B, the pre-electrode 272' is etched by using the fourth photoresist PR4 as an etch mask to form an auxiliary electrode 272. The etch also generates undercut such that edges of the auxiliary electrode 272 lies under the fourth photoresist PR4 and on the partition 32.

Finally, the fourth photoresist PR4 is removed as shown in FIGS. 19A and 19B.

The formation of the partition 32 and the auxiliary electrode 272 with a single photolithography step simplifies the manufacturing process and thus reduces the manufacturing cost. In addition, this process facilitates to manufacture a large OLED.

Referring to FIGS. 1-3, a plurality of organic light emitting members 30 preferably including multiple layers are formed in the openings by deposition or ink-jet printing following a masking, and a common electrode 270 are subsequently formed.

A buffer layer (not shown) preferably made of conductive organic material may be formed before the formation of the common electrode 270.

Now, an OLED having bottom gate TFTs according to an embodiment of the present invention will be described in detail with reference to FIGS. 23-25.

Figure 23:
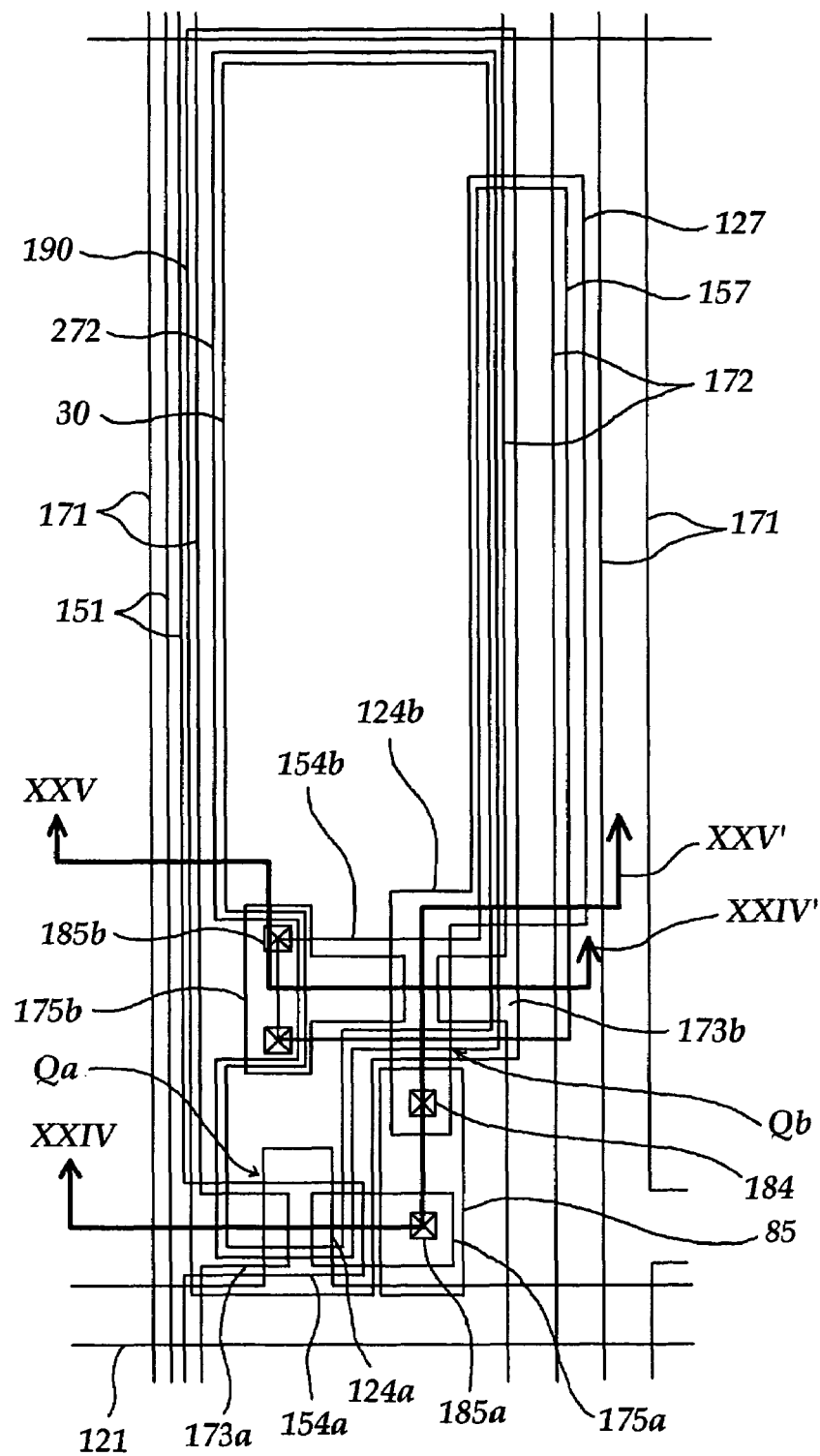
Figure 24:
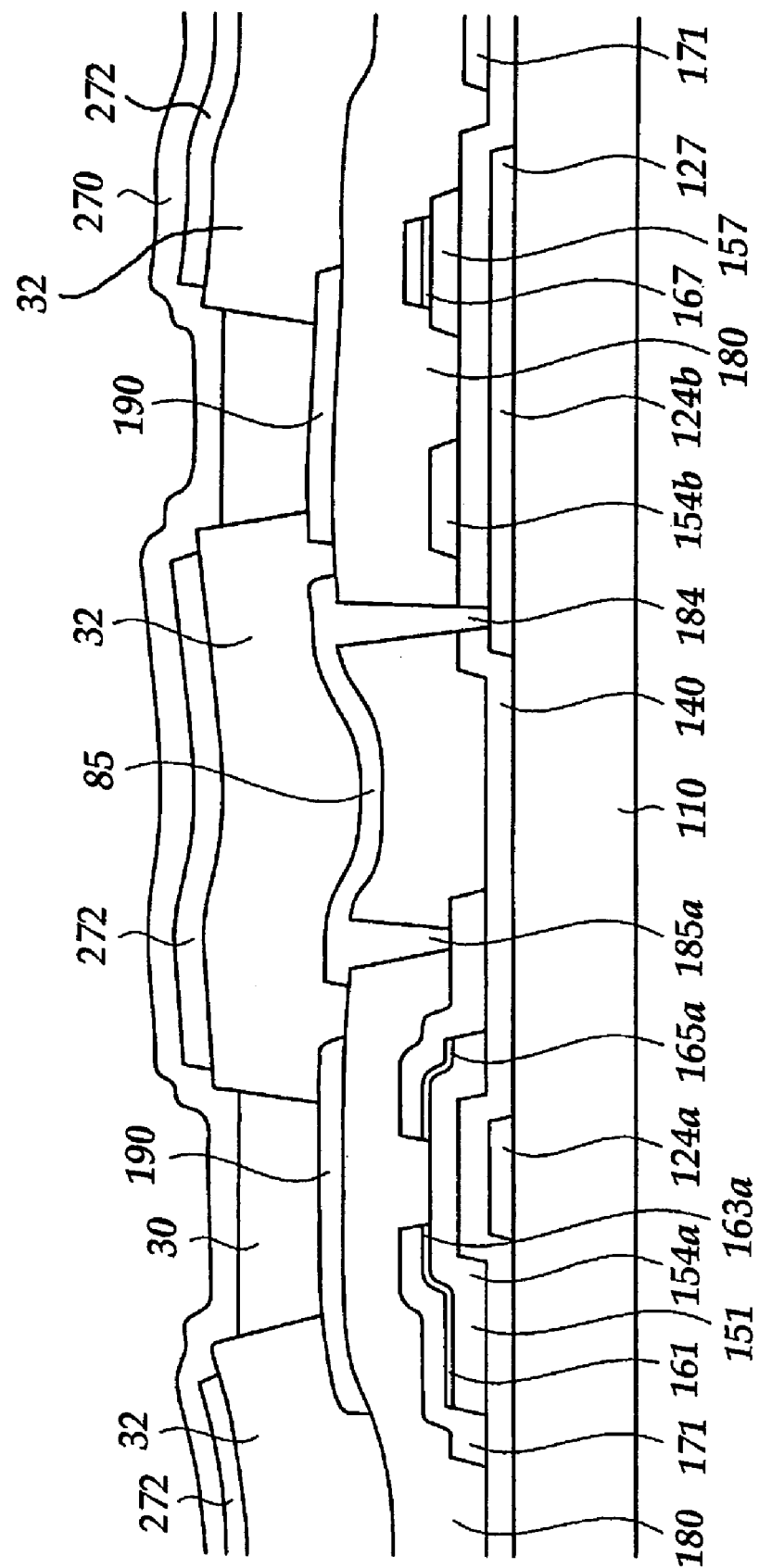
FIGS. 24 and 25 are sectional views of the OLED taken along the lines XXIV-XXIV' and XXV-XXV'.
Figure 25:
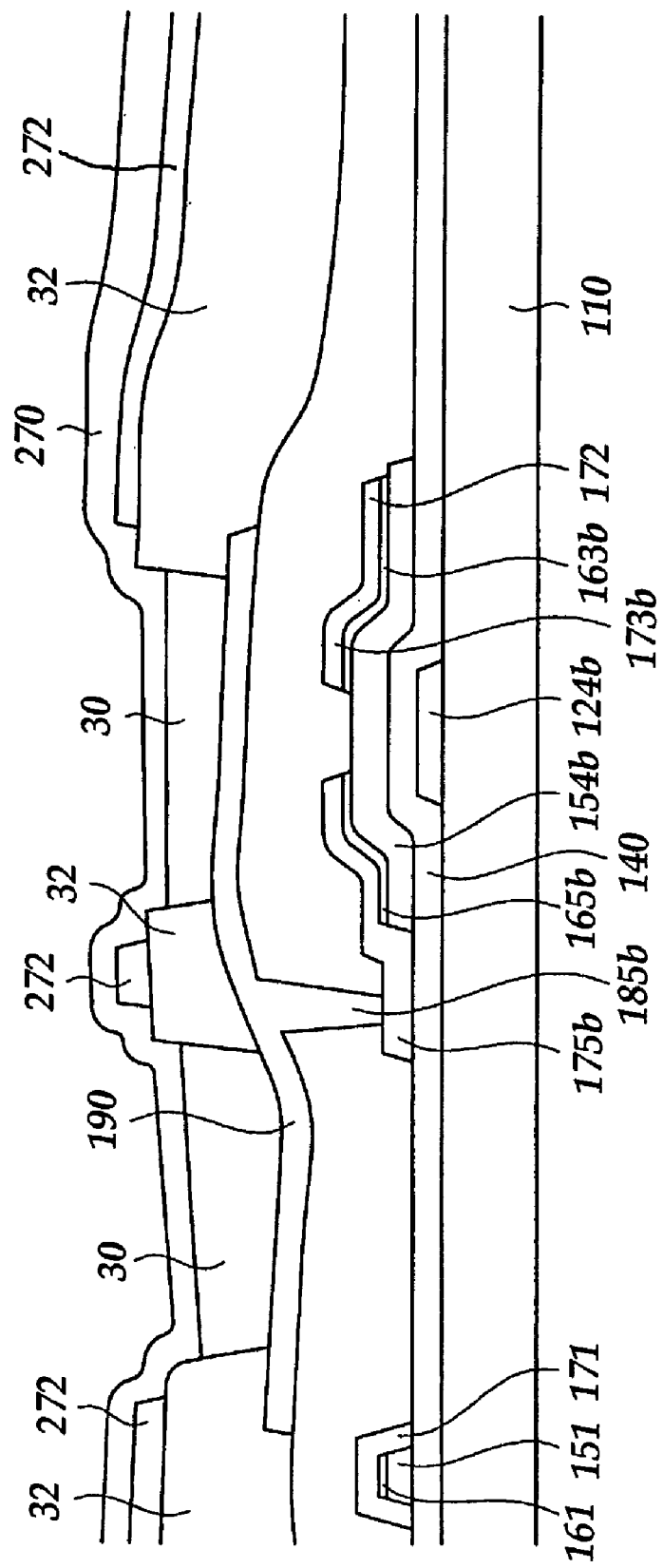

FIG. 23 is a layout view of an OLED according to another embodiment of the present invention and FIGS. 24 and 25 are sectional views of the OLED taken along the lines XXIV-XXIV' and XXV-XXV'.

A plurality of gate conductors that include a plurality of gate lines 121 including first gate electrodes 124a and a plurality of second gate electrodes 124b are formed on an insulating substrate 110 such as transparent glass.

The gate lines 121 transmitting gate signals extend substantially in a transverse direction and are separated from each other. The first gate electrodes 124a protrude upward. The gate lines 121 may extend to be connected to a driving circuit (not shown) integrated on the substrate 110, or it may have an end portion (not shown) having a large area for connection with another layer or an external driving circuit mounted on the substrate 110 or on another device such as a flexible printed circuit film (not shown) that may be attached to the substrate 110.

Each of the second gate electrodes 124b are separated from the gate lines 121 and includes a storage electrode 127 extending substantially in a transverse direction between two adjacent gate lines 121.

The gate conductors 121 and 124b are preferably made of Al containing metal such as Al and Al alloy, Ag containing metal such as Ag and Ag alloy, Cu containing metal such as Cu and Cu alloy, Mo containing metal such as Mo and Mo alloy, Cr, Ti or Ta. The gate conductors 121 and 124b may have a multi-layered structure including two films having different physical characteristics. One of the two films is preferably made of low resistivity metal including Al containing metal, Ag containing metal, or Cu containing metal for reducing signal delay or voltage drop in the gate conductors 121 and 124b. On the other hand, the other film is preferably made of material such as Cr, Mo, Mo alloy, Ta, or Ti, which has good physical, chemical, and electrical contact characteristics with other materials such as indium tin oxide (ITO) or indium zinc oxide (IZO). Good examples of the combination of the two films are a lower Cr film and an upper Al—Nd alloy film and a lower Al film and an upper Mo film.

In addition, the lateral sides of the gate conductors 121 and 124b are inclined relative to a surface of the substrate 110, and the inclination angle thereof ranges about 30-80 degrees.

A gate insulating layer 140 preferably made of silicon nitride (SiNx) is formed on the gate conductors 121 and 124b.

A plurality of semiconductor stripes and islands 151 and 154b preferably made of hydrogenated amorphous silicon (abbreviated to "a-Si") or polysilicon are formed on the gate insulating layer 140. Each semiconductor stripe 151 extends substantially in the longitudinal direction and has a plurality of projections 154a branched out toward the first gate electrodes 124a. Each semiconductor island 154b crosses a second gate electrode 124b and includes a portion overlapping the storage electrode 127 of the second gate electrode 124b.

A plurality of ohmic contact stripes 161 and ohmic contact islands 163b, 165a and 165b, which are preferably made of silicide or n+hydrogenated a-Si heavily doped with n type impurity such as phosphorous, are formed on the semiconductor stripes and islands 151 and 154b. Each ohmic contact stripe 161 has a plurality of projections 163a, and the projections 163a and the ohmic contact islands 165a are located in pairs on the projections 154a of the semiconductor stripes 151. The ohmic contact islands 163b and 165b are located in pairs on the semiconductor islands 154b.

The lateral sides of the semiconductor stripes and islands 151 and 154b and the ohmic contacts 161, 163b, 165b and 165b are inclined relative to a surface of the substrate, and the inclination angles thereof are preferably in a range between about 30-80 degrees.

A plurality of data conductors including a plurality of data lines 171, a plurality of voltage transmission lines 172, and a plurality of first and second drain electrodes 175a and 175b are formed on the ohmic contacts 161, 163b, 165b and 165b and the gate insulating layer 140.

The data lines 171 for transmitting data signals extend substantially in the longitudinal direction and intersect the gate lines 121. Each data line 171 includes a plurality of first source electrodes 173a an end portion having a large area for contact with another layer or an external device. The data lines 171 may be directly connected to a data driving circuit for generating the gate signals, which may be integrated on the substrate 110.

The voltage transmission lines 172 for transmitting driving voltages extend substantially in the longitudinal direction and intersect the gate lines 121. Each voltage transmission line 172 includes a plurality of second source electrodes 173b. The voltage transmission lines 171 may be connected to each other.

The first and the second drain electrodes 175a and 175b are separated from the data lines 171 and the voltage transmission lines 172 and from each other. Each pair of the first source electrodes 173a and the first drain electrodes 175a are disposed opposite each other with respect to a first gate electrode 124a, and each pair of the second source electrodes 173b and the second drain electrodes 175b are disposed opposite each other with respect to a second gate electrode 124b.

A first gate electrode 124a, a first source electrode 173a, and a first drain electrode 175a along with a projection 154a of a semiconductor stripe 151 form a switching TFT Qa having a channel formed in the projection 154a disposed between the first source electrode 173a and the first drain electrode 175a. Meanwhile, a second gate electrode 124b, a second source electrode 173b, and a second drain electrode 175b along with a semiconductor island 154b form a driving TFT Qb having a channel formed in the semiconductor island 154b disposed between the second source electrode 173b and the second drain electrode 175b.

The data conductors 171, 172, 175a and 175b are preferably made of refractory metal including Cr, Mo, Ti, Ta or alloys thereof. They may have a multi-layered structure preferably including a low resistivity film and a good contact film. A good example of the multi-layered structure includes a Mo lower film, an Al middle film, and a Mo upper film as well as the above-described combinations of a Cr lower film and an Al—Nd upper film and an Al lower film and a Mo upper film.

Like the gate conductors 121 and 124b, the data conductors 171, 172, 175a and 175b have tapered lateral sides relative to the surface of the substrate 110, and the inclination angles thereof range about 30-80 degrees.

The ohmic contacts 161, 163b, 165b and 165b are interposed only between the underlying semiconductor stripes and islands 151 and 154b and the overlying data conductors 171, 172, 175a and 175b thereon and reduce the contact resistance therebetween. The semiconductor stripes 151 include a plurality of exposed portions, which are not covered with the data conductors 171, 172, 175a and 175b.

A passivation layer 180 is formed on the data conductors 171, 172, 175a and 175b and the exposed portions of the semiconductor stripes and islands 151 and 154b. The passivation layer 180 is preferably made of inorganic material such as silicon nitride or silicon oxide, photosensitive organic material having a good flatness characteristic, or low dielectric insulating material having dielectric constant lower than 4.0 such as a-Si:C:O and a-Si:O:F formed by plasma enhanced chemical vapor deposition (PECVD). The passivation layer 180 may include a lower film of inorganic insulator and an upper film of organic insulator.

The passivation layer 180 has a plurality of contact holes 184, 185a and 185b exposing portions of the second gate electrodes 124b and the first and the second drain electrodes 175a and 175b, respectively.

A plurality of pixel electrodes 190 and a plurality of connecting members 85 are formed on the passivation layer 180. The pixel electrodes 190 are connected to the second drain electrodes 175b through the contact holes 185b and they are preferably made of at least one of reflective opaque material such as Al or Ag alloy. However, the pixel electrode 190 may be made of transparent conductor such as ITO or IZO and opaque reflective conductor such as Al, Ag, Ca, Ba and Mg. The pixel electrode 190 may be incorporated with the second drain electrode 175b for reducing the manufacturing cost.

A plurality of contact assistants or connecting members (not shown) may be also formed on the passivation layer 180 such that they are connected to the exposed end portions of the gate lines 121 or the data lines 171.

A partition 32, an auxiliary electrode 272, a plurality of light emitting members 30, and a common electrode 270 are formed on the passivation layer 180, the pixel electrodes 190, and the connecting members 85 like those shown in FIGS. 1-3.

A method of manufacturing the TFT array panel shown in FIGS. 23-25 according to an embodiment of the present invention will be now described in detail with reference to FIGS. 26 to 37B as well as FIGS. 23-25.

Figure 26:
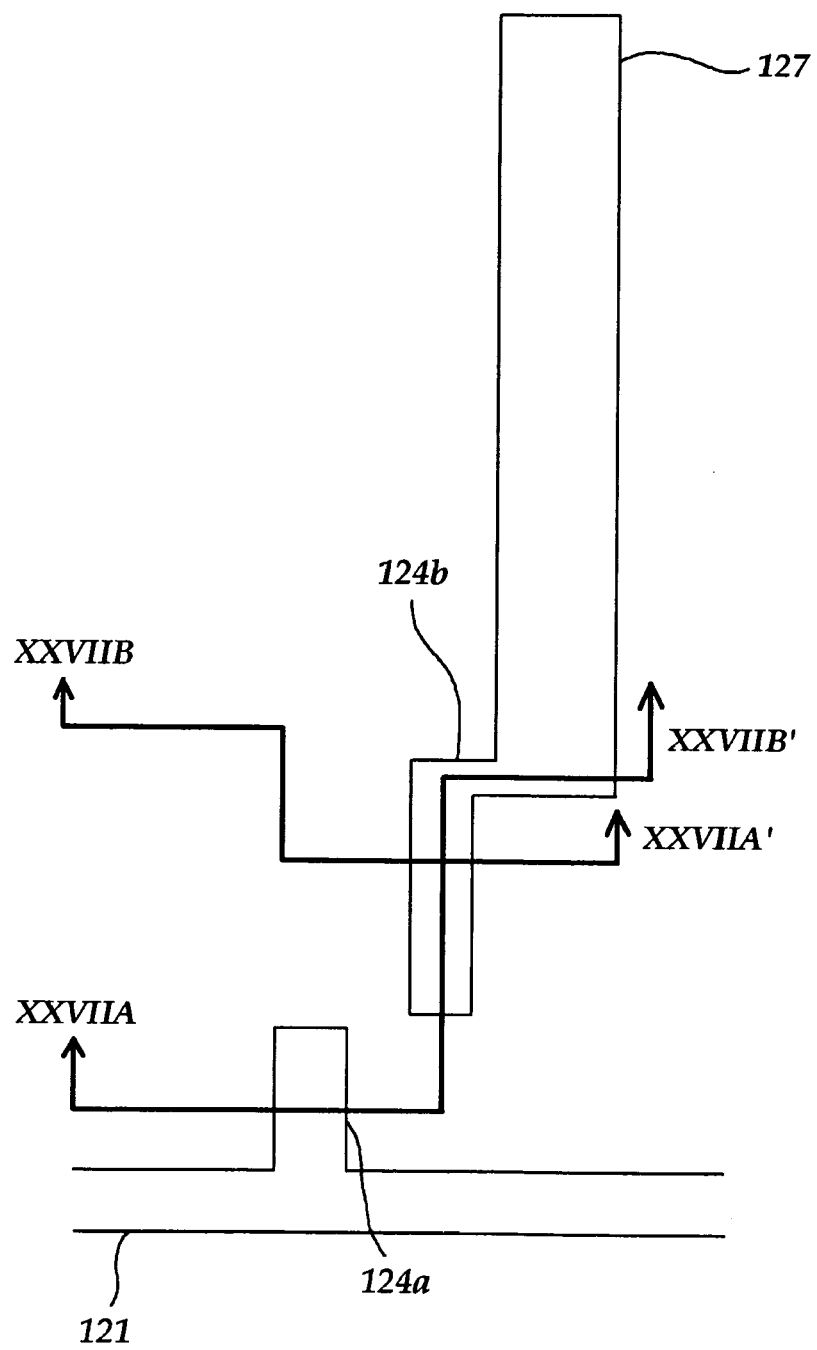
FIGS. 26, 28, 30, 32, 34 and 36 are layout views of the OLED shown in FIGS. 23-25 in intermediate steps of a manufacturing method thereof according to an embodiment of the present invention.
Figure 27A:
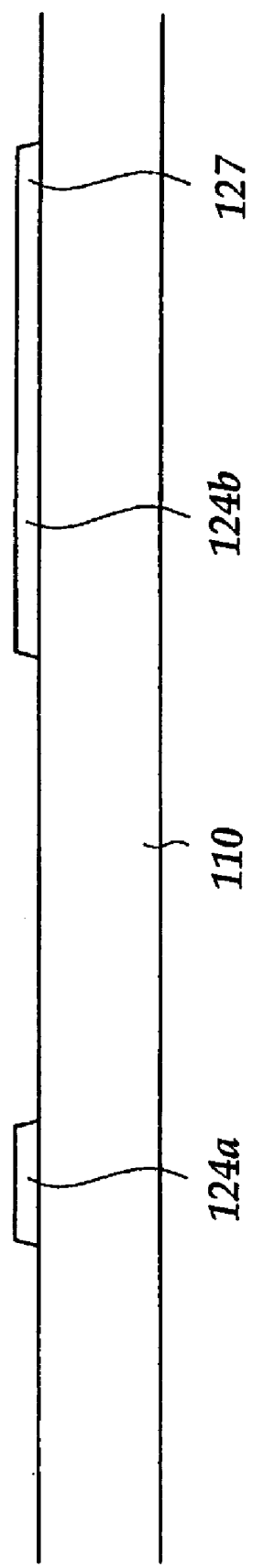
FIGS. 27A and 27B are sectional views of the OLED shown in FIG. 26 taken along the lines XXVIIA-VA' and XXVIIB-XXVIIB', respectively.
Figure 27B:
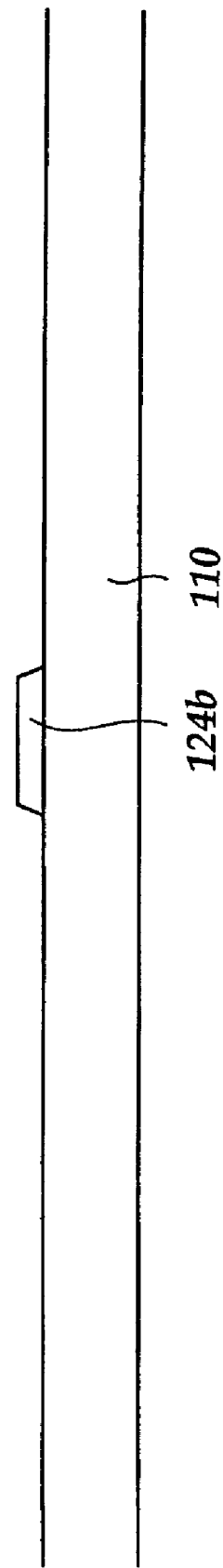
Figure 28:
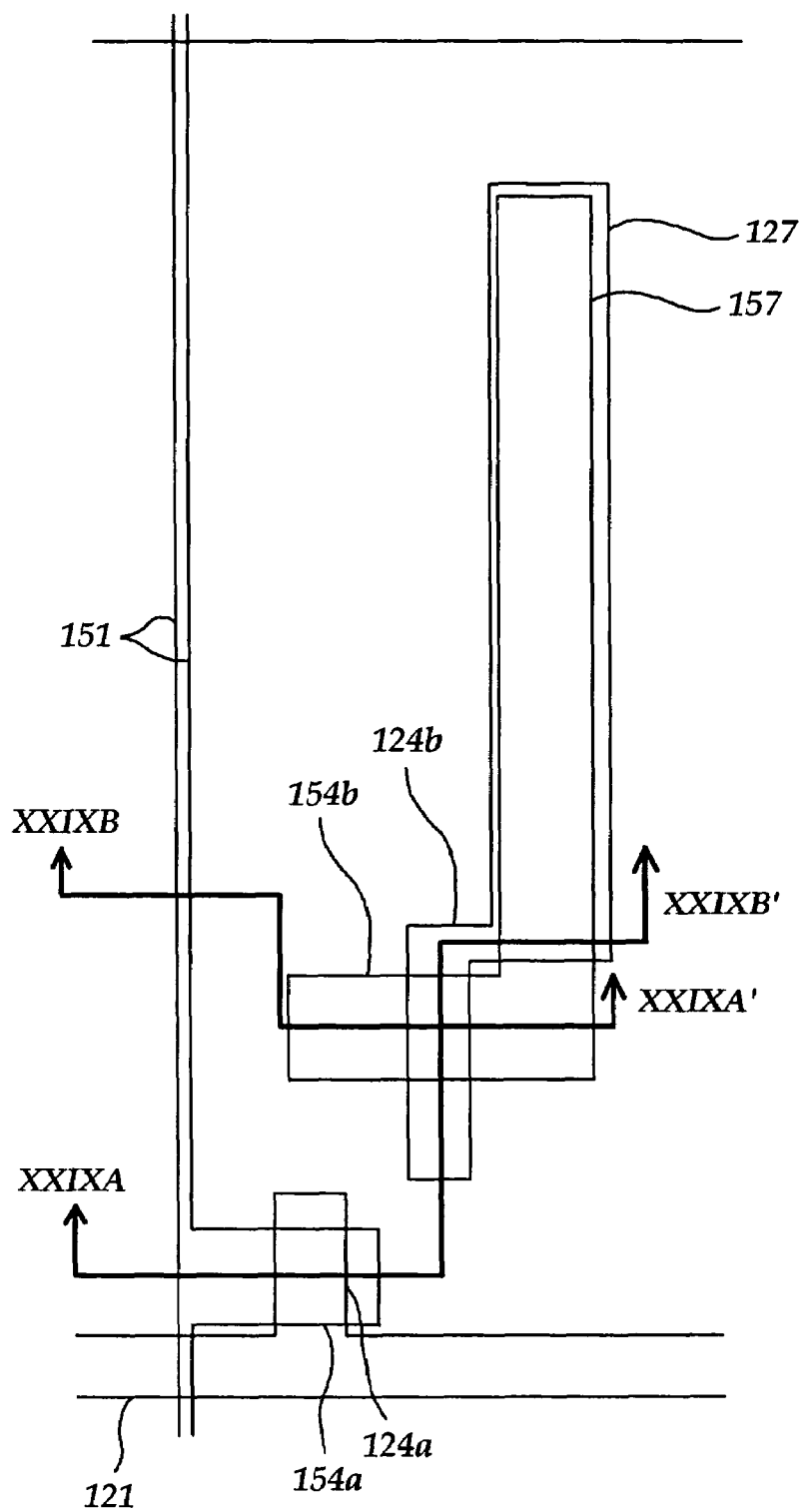
Figure 29A:
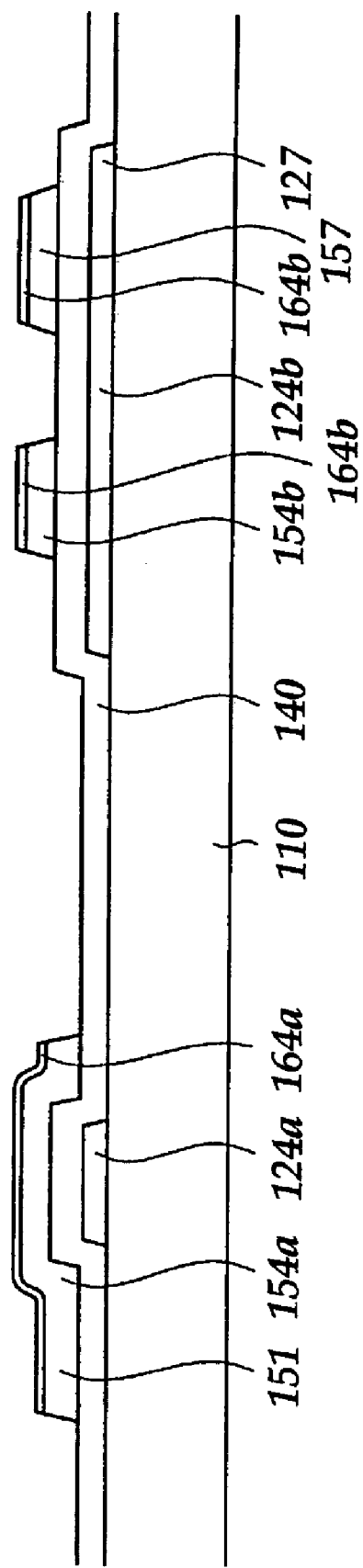
FIGS. 29A and 29B are sectional views of the OLED shown in FIG. 28 taken along the lines XXIXA-XXIXA' and XXIXB-XXIXB', respectively.
Figure 29B:
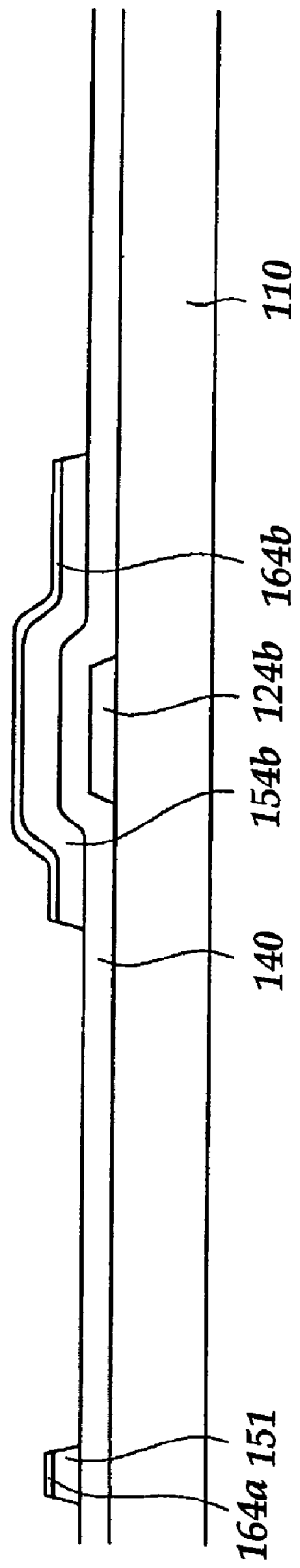
Figure 30:
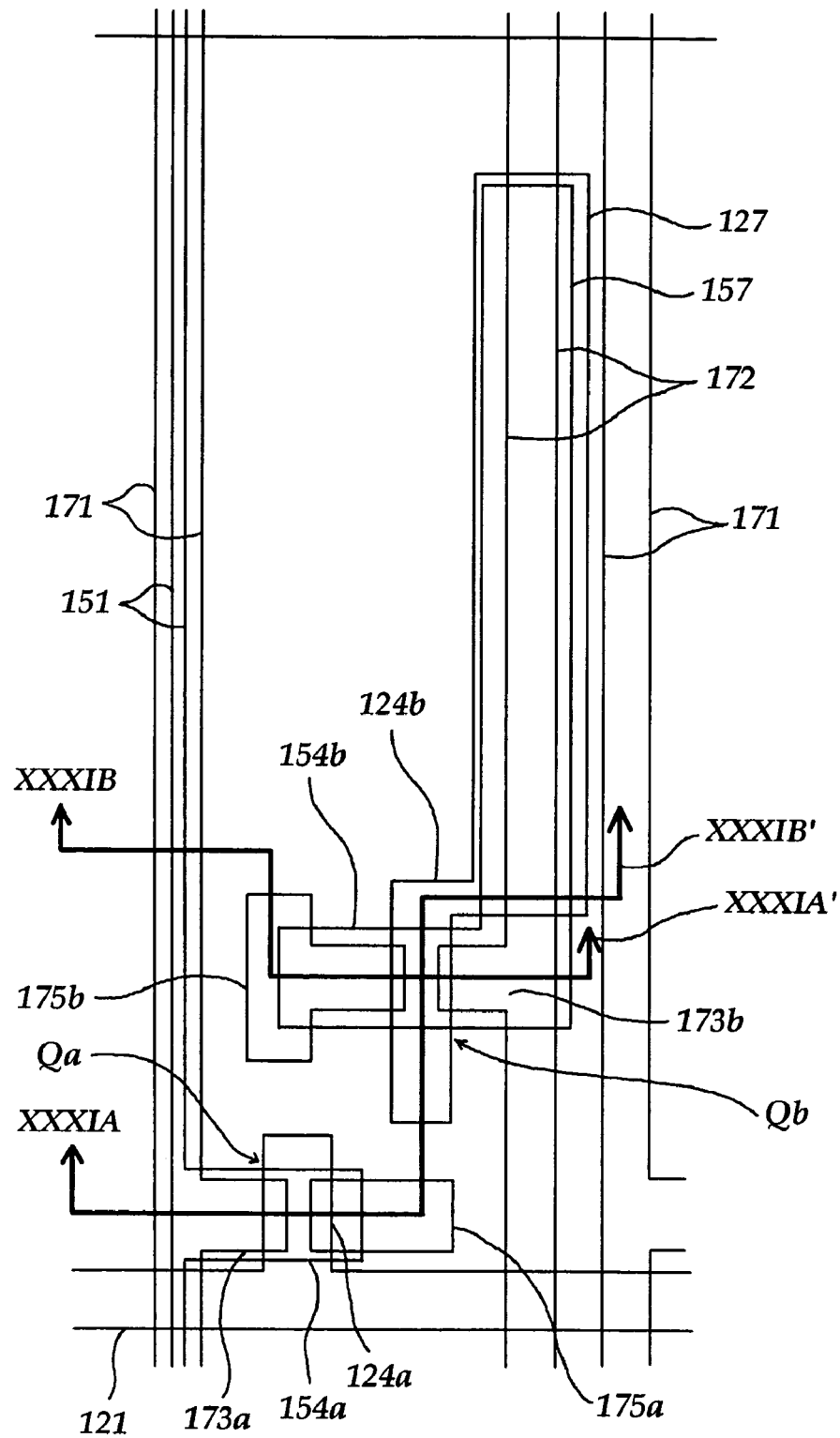
Figure 31A:
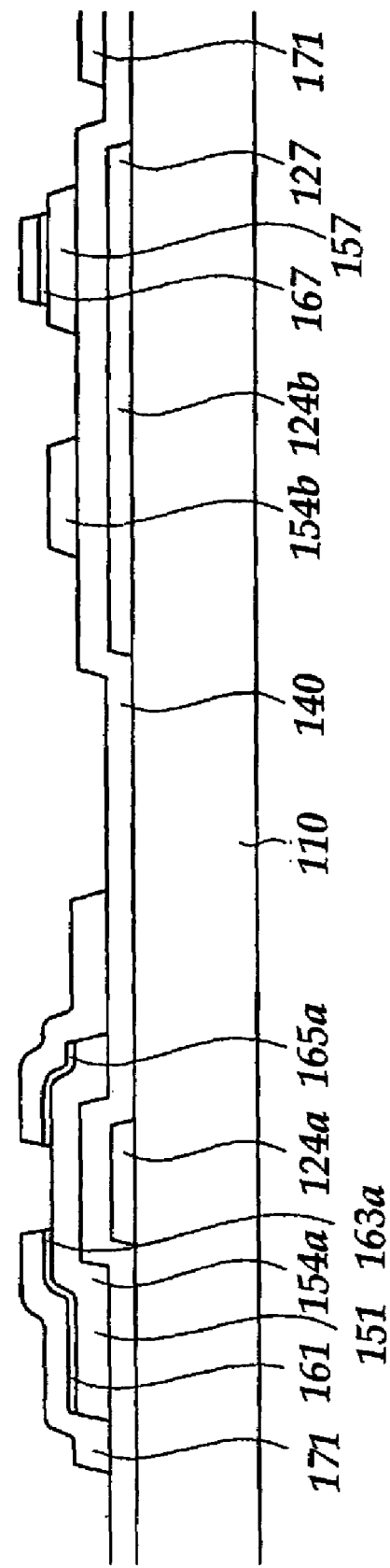
FIGS. 31A and 31B are sectional views of the OLED shown in FIG. 30 taken along the lines XXXIA-XXXIA' and XXXIB-XXXIB', respectively.
Figure 31B:
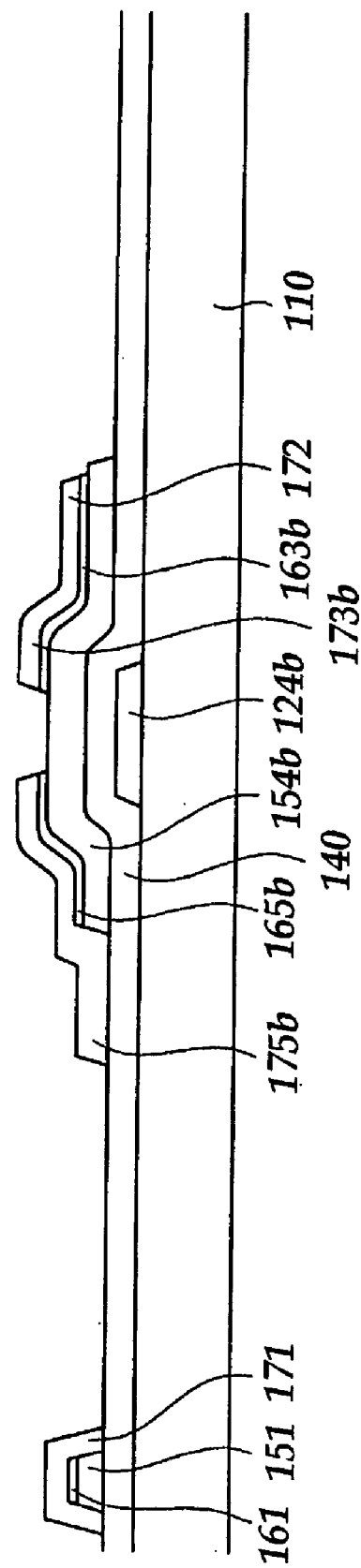
Figure 32:
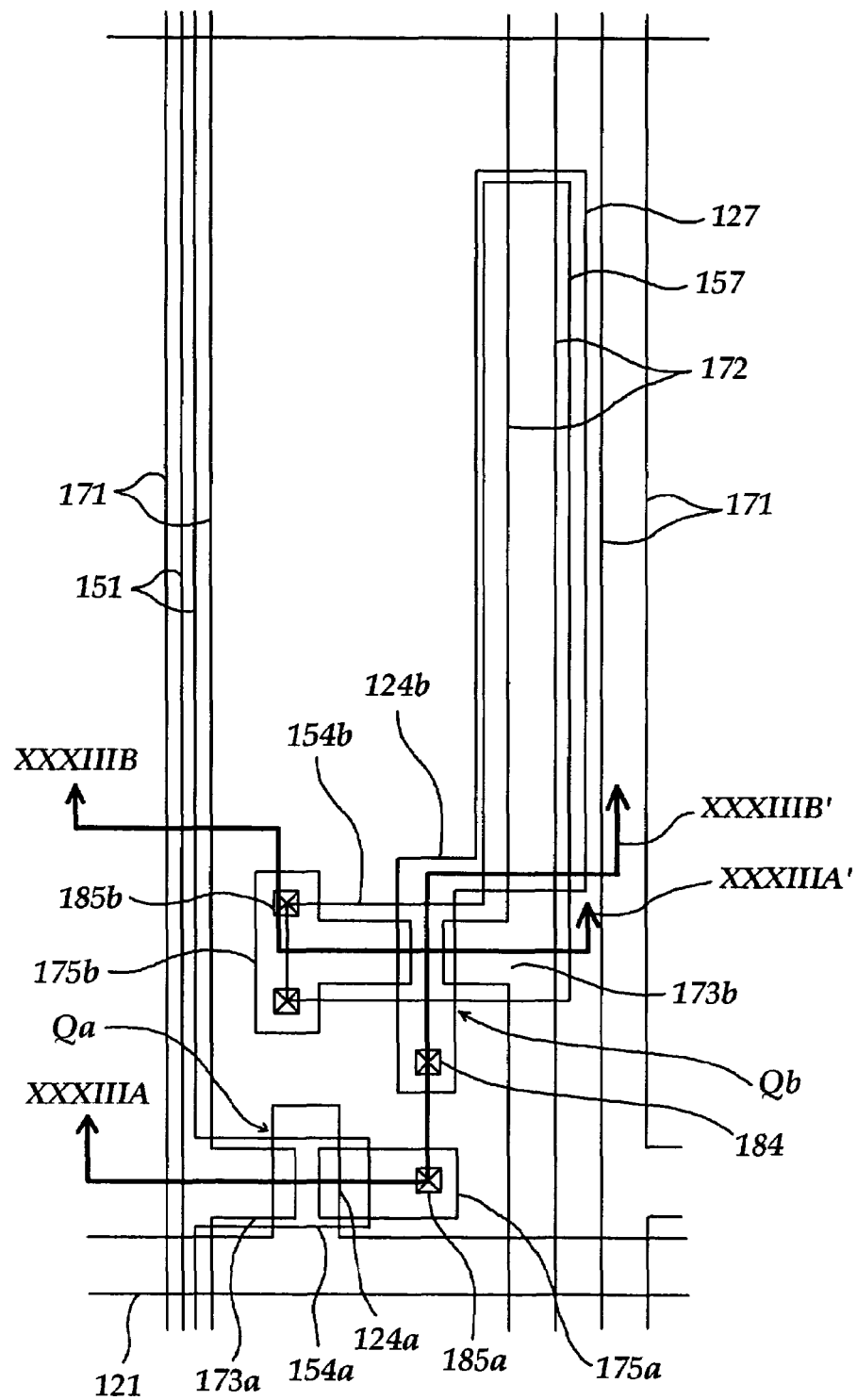
Figure 33A:
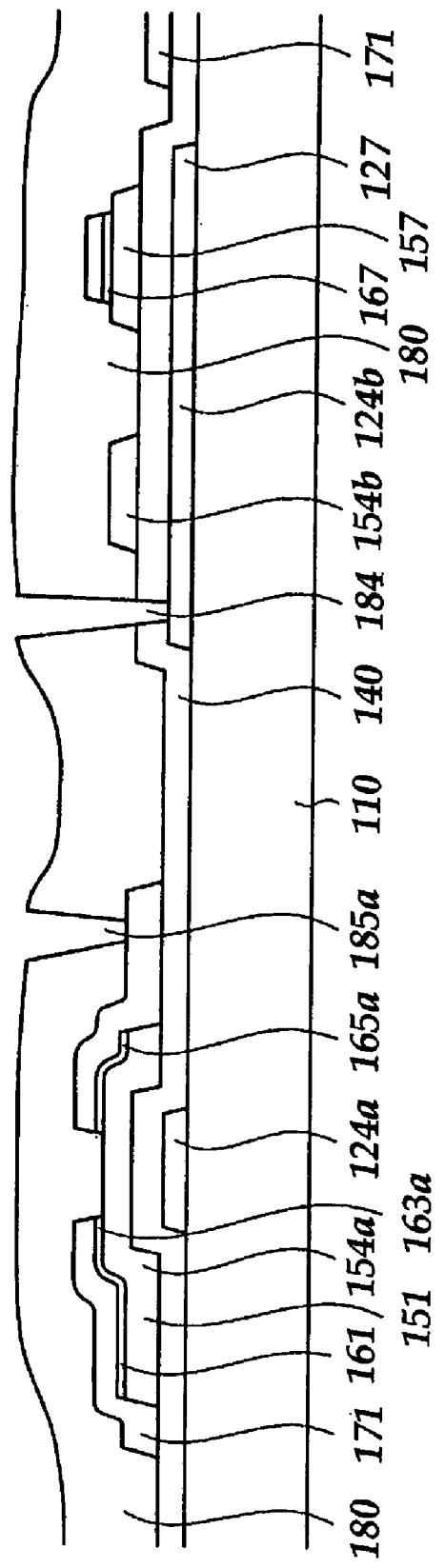
FIGS. 33A and 33B are sectional views of the OLED shown in FIG. 32 taken along the lines XXXIIIA-XXXIIIA' and XXXIIIB-XXXIIIB', respectively.
Figure 33B:
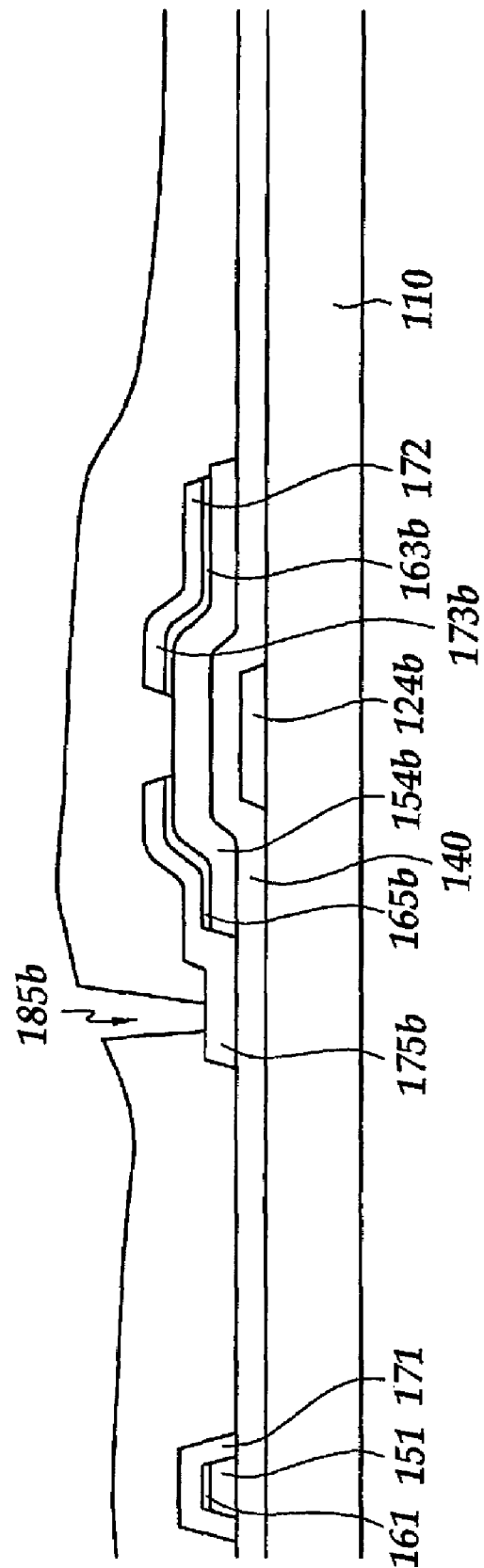
Figure 34:
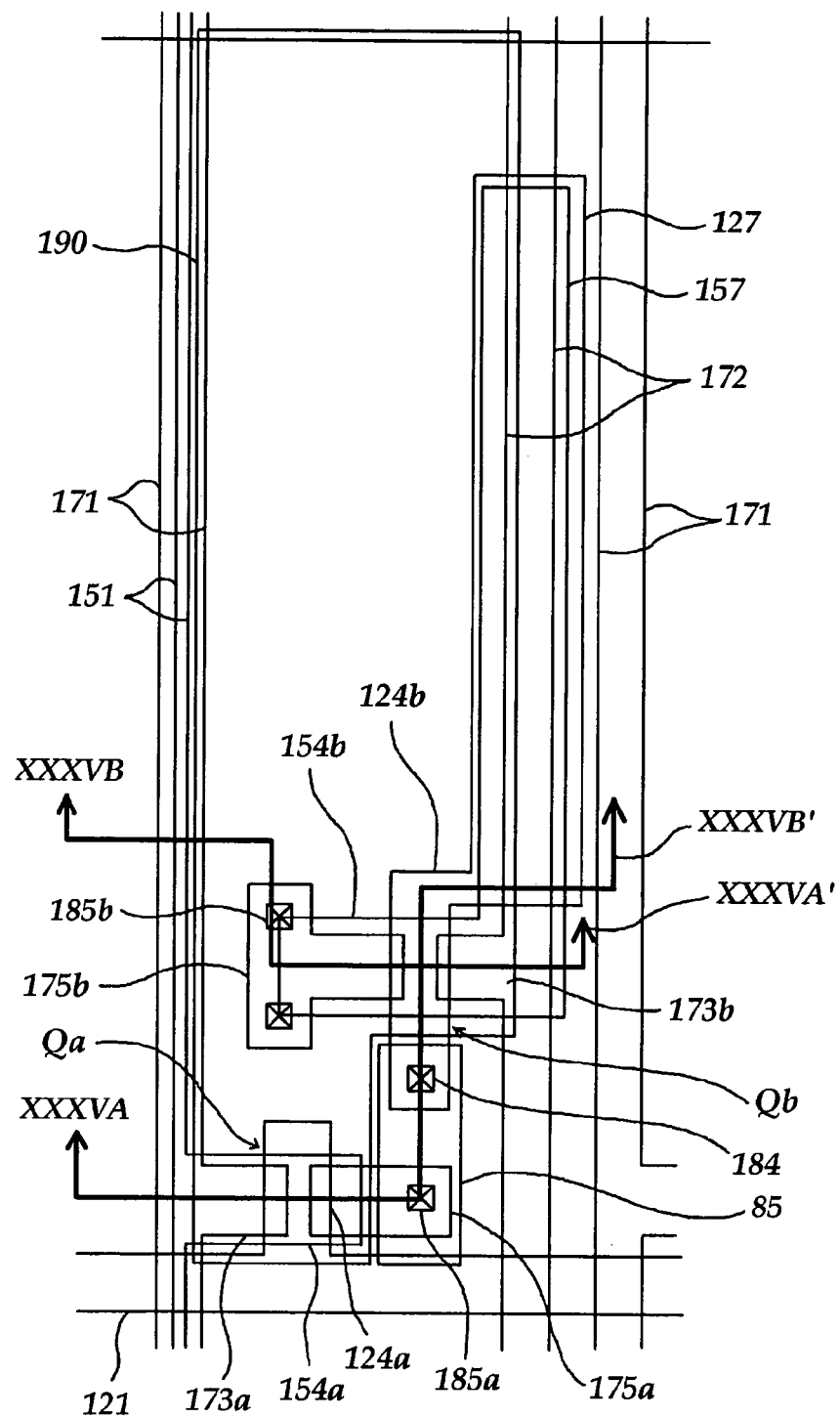
Figure 35A:
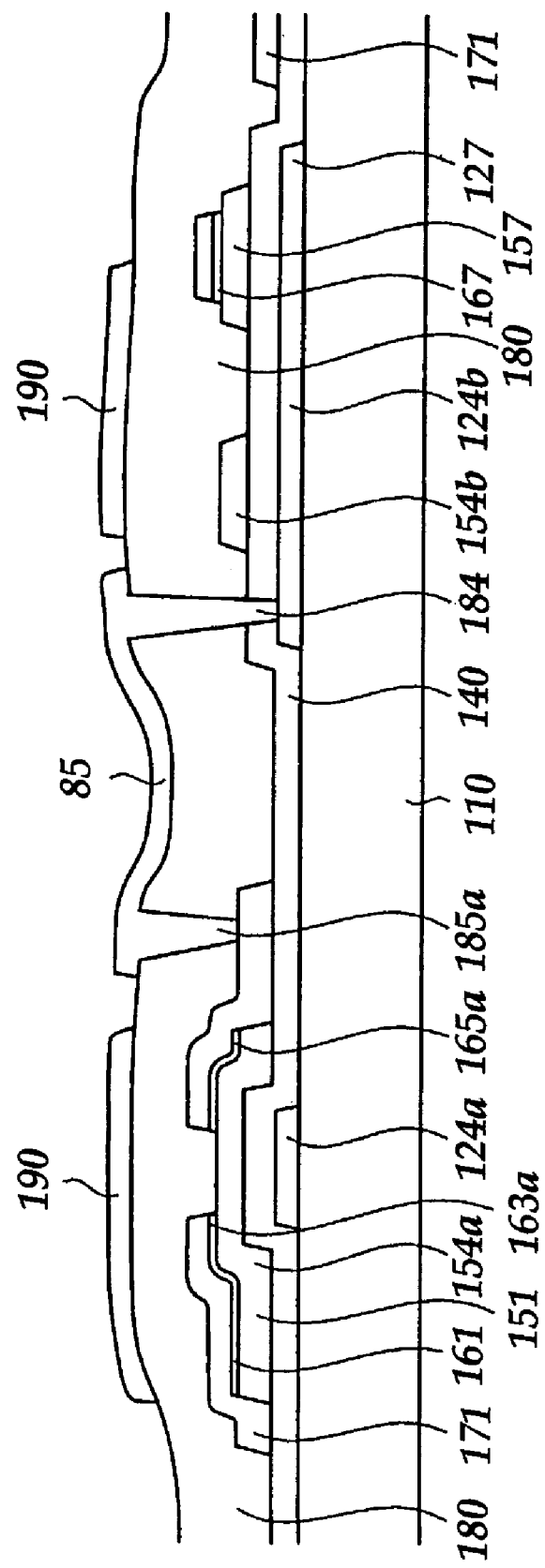
FIGS. 35A and 35B are sectional views of the OLED shown in FIG. 34 taken along the lines XXXVA-XXXVA' and XXXVB-XXXVB', respectively.
Figure 35B:
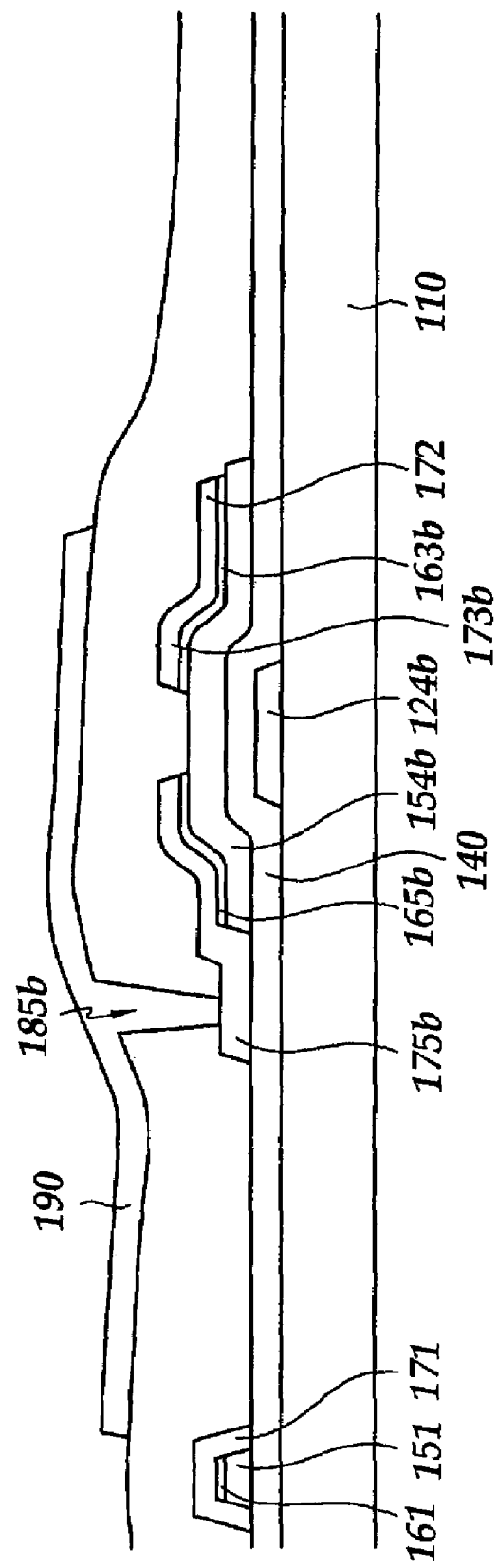
Figure 36:
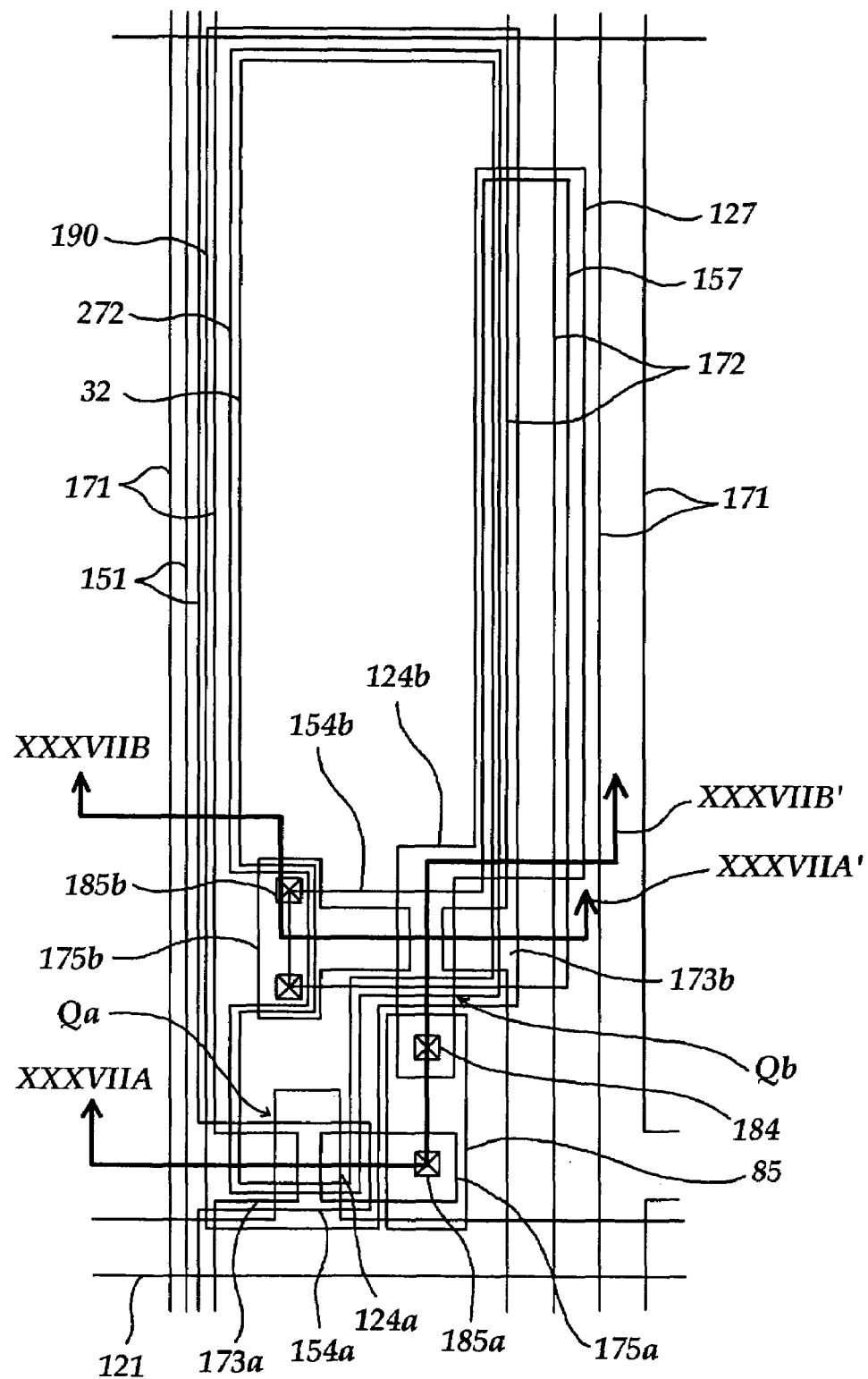
Figure 37A:
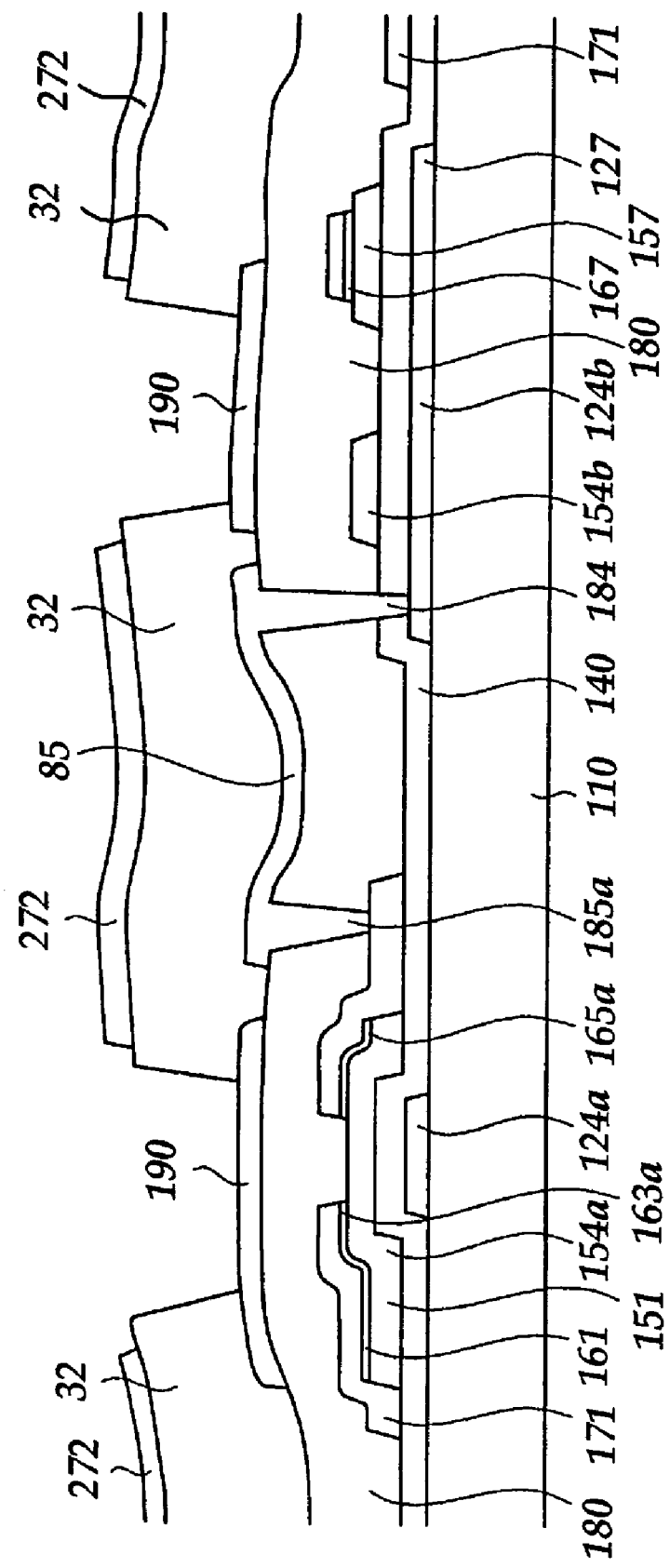
FIGS. 37A and 37B are sectional views of the OLED shown in FIG. 36 taken along the lines XXXVIIA-XXXVIIA' and XXXVIIB-XXXVIIB', respectively.
Figure 37B:
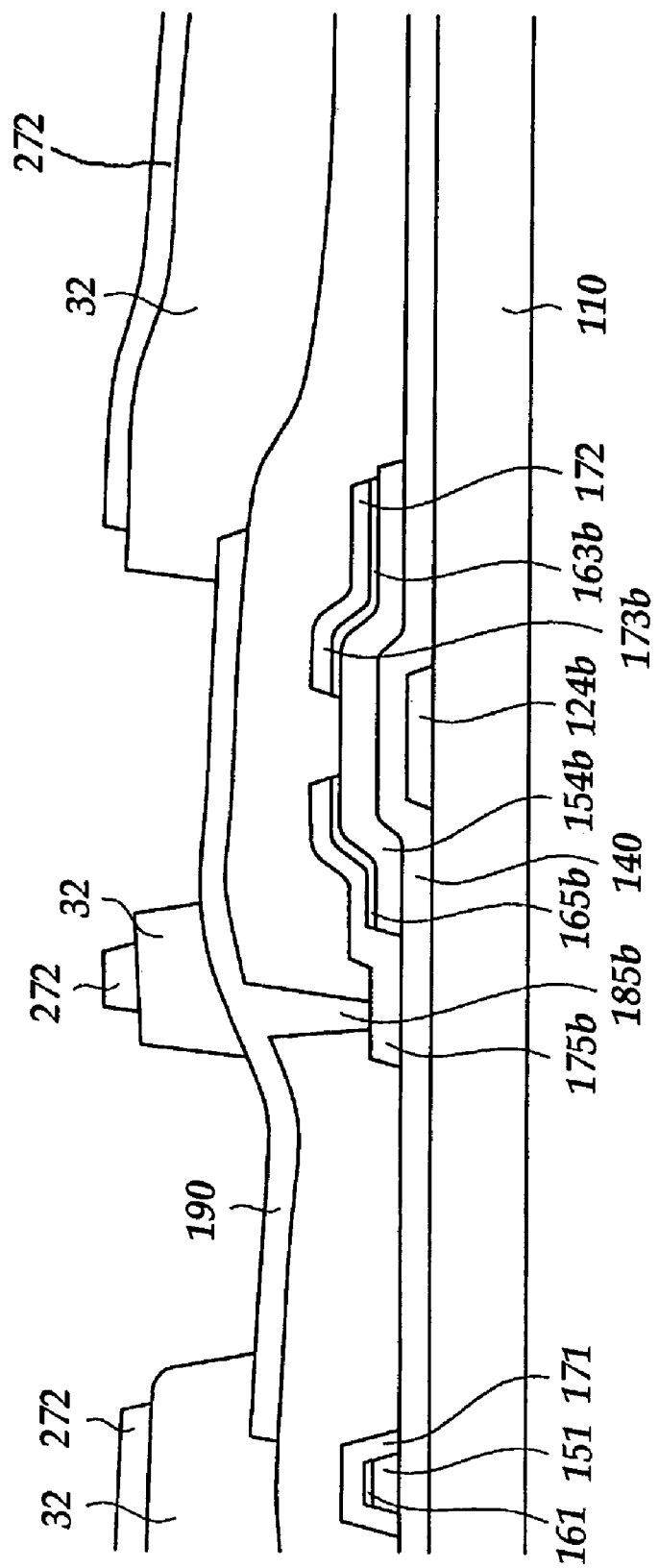

FIGS. 26, 28, 30, 32, 34 and 36 are layout views of the OLED shown in FIGS. 23-25 in intermediate steps of a manufacturing method thereof according to an embodiment of the present invention, FIGS. 27A and 27B are sectional views of the OLED shown in FIG. 26 taken along the lines XXVIIA-VA' and XXVIIB-XXVIIB', respectively, FIGS. 29A and 29B are sectional views of the OLED shown in FIG. 28 taken along the lines XXIXA-XXIXA' and XXIXB-XXIXB', respectively, FIGS. 31A and 31B are sectional views of the OLED shown in FIG. 30 taken along the lines XXXIA-XXXIA' and XXXIB-XXXIB', respectively, FIGS. 33A and 33B are sectional views of the OLED shown in FIG. 32 taken along the lines XXXIIIA-XXXIIIA' and XXXIIIB-XXXIIIB', respectively, FIGS. 35A and 35B are sectional views of the OLED shown in FIG. 34 taken along the lines XXXVA-XXXVA' and XXXVB-XXXVB', respectively, and FIGS. 37A and 37B are sectional views of the OLED shown in FIG. 36 taken along the lines XXXVIIA-XXXVIIA' and XXXVIIB-XXXVIIB', respectively.

Referring to FIGS. 26-27B, a plurality of gate conductors that includes a plurality of gate lines 121 including first gate electrodes 124a and a plurality of second gate electrodes 124b including storage electrodes 127 are formed on a substrate such as transparent glass.

Referring to FIGS. 28-29B, after sequential deposition of a gate insulating layer 140, an intrinsic a-Si layer, and an extrinsic a-Si layer, the extrinsic a-Si layer and the intrinsic a-Si layer are photo-etched to form a plurality of extrinsic semiconductor stripes and islands 164a and 164b and a plurality of intrinsic semiconductor stripes and islands 151 and 154b including projections 154a on the gate insulating layer 140. The gate insulating layer 140 is preferably made of silicon nitride with thickness of about 2,000 Å to about 5,000 Å, and the deposition temperature is preferably in a range of about 250-500° C.

Referring to FIGS. 30-31B, a conductive layer is sputtered and etched using a photoresist (not shown) to form a plurality of data conductors that includes a plurality of data lines 171 including first source electrodes 173a, a plurality of voltage transmission lines 172 including second source electrodes 173b, and a plurality of first and second drain electrodes 175a and 175b.

Before or after removing the photoresist, portions of the extrinsic semiconductor stripes 164, which are not covered with the data conductors 171, 172, 175a and 175b, are removed by etch to complete a plurality of ohmic contact stripes 161 including projections 163a and a plurality of ohmic contact islands 163b, 165a and 165b and to expose portions of the intrinsic semiconductor stripes and islands 151 and 154b.

Oxygen plasma treatment may follow thereafter in order to stabilize the exposed surfaces of the semiconductor stripes 151.

Referring to FIGS. 32-33B, a passivation layer 180 is deposited and patterned to form a plurality of contact holes 184, 185a and 185b exposing the first gate electrodes 124b and the first and the second drain electrodes 175a and 175b.

Referring to FIGS. 34-35B, a plurality of pixel electrodes 190 and a plurality of connecting members 85 are formed on the passivation layer 180.

Referring to FIGS. 36-37B, a partition 32 and an auxiliary electrode 272 are formed by using a single photolithography step shown in FIGS. 20A-22B.

Finally, a plurality of organic light emitting members 30 preferably including multiple layers are formed in the openings by deposition or inkjet printing following a masking, and a common electrode 270 are subsequently formed as shown in FIGS. 23-25.

As described above, the formation of the partition 32 and the auxiliary electrode 272 with a single photolithography step simplifies the manufacturing process and thus reduces the manufacturing cost. In addition, this process facilitates to manufacture a large OLED.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. An organic light emitting display comprising:
    a passivation layer and a first electrode formed on a substrate, the first electrode disposed on the passivation layer;
    a partition formed on the passivation layer and the first electrode, the partition having an opening exposing the first electrode at least in part;
    an auxiliary electrode formed on the partition and having substantially the same planar shape as the partition;
    an organic light emitting member formed on the first electrode; and
    a second electrode formed on and contacting the light emitting member, the auxiliary electrode and a side of the partition at the opening.

2. The organic light emitting display of claim 1, further comprising:
    a gate line transmitting gate signals;
    a data line transmitting data signals;
    a switching transistor connected to the gate line and the data line;
    a signal transmission line transmitting driving signals; and
    a driving transistor connected to the signal transmission line and the first electrode and controlled by the data signals.

3. The organic light emitting display of claim 2, wherein the switching transistor and the driving transistor are connected to each other and the organic light emitting display further comprises a storage capacitor connected between the switching transistor and the signal transmission line.

4. The organic light emitting display of claim 1, wherein the first electrode comprises reflective material.

5. The organic light emitting display of claim 1, wherein the second electrode comprises transparent material.

6. The organic light emitting display of claim 1, wherein the auxiliary electrode has a resistivity lower than the second electrode.

7. An organic light emitting display comprising:
    first and second semiconductor members including first and second intrinsic portions, respectively, and including amorphous silicon or polysilicon;
    a plurality of gate conductors that include a gate line including a first gate electrode overlapping the first intrinsic portion and a second gate electrode overlapping the second intrinsic portion;
    a gate insulating layer disposed between the first and the second semiconductor members and the gate conductors;
    a plurality of data conductors that includes a data line including a first source electrode connected to the first semiconductor member, a first drain electrode opposing the first source electrode with respect to the first intrinsic portion and connected to the first semiconductor member, a voltage transmission line including a second source electrode connected to the second semiconductor member, and a second drain electrode opposing the second source electrode with respect to the second intrinsic portion and connected to the second semiconductor member;
    a pixel electrode connected to the second drain electrode;
    a partition having an opening exposing the pixel electrode at least in part;
    an auxiliary electrode formed on the partition and having substantially the same planar shape as the partition;
    an organic light emitting member formed on the pixel electrode; and
    a common electrode formed on and contacting the light emitting member, the auxiliary electrode and a side of the partition at the opening.

8. The organic light emitting display of claim 7, wherein the pixel electrode comprises reflective material.

9. The organic light emitting display of claim 7, wherein the common electrode comprises transparent material.

10. The organic light emitting display of claim 7, wherein the auxiliary electrode has a resistivity lower than the common electrode.

11. The organic light emitting display of claim 7, further comprising a connecting member connecting the first drain electrode and the second gate electrode.

12. An organic light emitting display comprising:
    a thin film transistor;
    an insulating layer formed on the thin film transistor;
    a first electrode formed on the insulating layer;
    a partition formed on the first electrode, the partition having an opening exposing the first electrode at least in part;
    an auxiliary electrode formed on the partition and having substantially the same planar shape as the partition;
    an organic light emitting member formed on the first electrode; and
    a second electrode formed on and contacting the light emitting member, the auxiliary electrode and a side of the partition at the opening.

* * * * *